(12) United States Patent
Kurata et al.

(10) Patent No.: US 8,383,491 B2
(45) Date of Patent: Feb. 26, 2013

(54) METHOD FOR MANUFACTURING SEMICONDUCTOR SUBSTRATE

(75) Inventors: Motomu Kurata, Atsugi (JP); Shinya Sasagawa, Chigasaki (JP); Taiga Muraoka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 76 days.

(21) Appl. No.: 12/564,961

(22) Filed: Sep. 23, 2009

(65) Prior Publication Data
US 2010/0081253 A1 Apr. 1, 2010

(30) Foreign Application Priority Data
Sep. 29, 2008 (JP) .................... 2008-251335

(51) Int. Cl.
*H01L 21/30* (2006.01)
*H01L 21/46* (2006.01)
(52) U.S. Cl. ........ 438/458; 438/455; 438/967; 438/974; 257/E21.568
(58) Field of Classification Search .......... 438/455–459; 257/E21.567, E21.569
See application file for complete search history.

(56) References Cited

U.S. PATENT DOCUMENTS

| | | | |
|---|---|---|---|
| 5,371,037 A | 12/1994 | Yonehara | |
| 5,750,000 A | 5/1998 | Yonehara et al. | |
| 5,840,616 A | 11/1998 | Sakaguchi et al. | |
| 5,854,123 A | 12/1998 | Sato et al. | |
| 5,966,620 A | 10/1999 | Sakaguchi et al. | |
| 6,054,363 A | 4/2000 | Sakaguchi et al. | |
| 6,362,076 B1 | 3/2002 | Inazuki et al. | |
| 6,372,609 B1 | 4/2002 | Aga et al. | |
| 6,380,046 B1 | 4/2002 | Yamazaki | |
| 6,566,278 B1 | 5/2003 | Harvey et al. | |
| 6,583,440 B2 | 6/2003 | Yasukawa | |

(Continued)

FOREIGN PATENT DOCUMENTS

| | | |
|---|---|---|
| JP | 11-163363 | 6/1999 |
| JP | 11-307472 | 11/1999 |

(Continued)

OTHER PUBLICATIONS

Baldacchini et al. "Superhydrophobic Surfaces Prepared by Microstructuring of Silicon Using a Femtosecond Laser", Langmuir 2006, 22, 4917-4919.*

*Primary Examiner* — Leonard Chang
(74) *Attorney, Agent, or Firm* — Eric J. Robinson; Robinson Intellectual Property Law Office, P.C.

(57) ABSTRACT

A step of forming an insulating film over a semiconductor substrate and forming an embrittled region in the semiconductor substrate by irradiating the semiconductor substrate with accelerated ions through the insulating film; a step of disposing a surface of the semiconductor substrate and a surface of a base substrate opposite to each other and bonding the surface of the insulating film to the surface of the base substrate; a step of forming a semiconductor layer over the base substrate with the insulating film interposed therebetween by causing separation along the embrittled region by performing heat treatment after the surface of the insulating film and the surface of the base substrate are bonded to each other; a step of performing etching treatment on the semiconductor layer; a step of irradiating the semiconductor layer subjected to the etching treatment with a laser beam; and a step of irradiating the semiconductor layer irradiated with the laser beam with plasma.

26 Claims, 16 Drawing Sheets

U.S. PATENT DOCUMENTS

| | | |
|---|---|---|
| 6,703,254 B2 | 3/2004 | Saitoh et al. |
| 6,803,264 B2 | 10/2004 | Yamazaki et al. |
| 6,818,921 B2 | 11/2004 | Yasukawa |
| 7,056,808 B2 | 6/2006 | Henley et al. |
| 7,112,514 B2 | 9/2006 | Yasukawa |
| 7,199,024 B2 | 4/2007 | Yamazaki |
| 7,300,853 B2 | 11/2007 | Joly et al. |
| 2004/0147095 A1 | 7/2004 | Yamazaki |
| 2007/0281172 A1* | 12/2007 | Couillard et al. ............ 428/446 |
| 2007/0281399 A1 | 12/2007 | Cites et al. |
| 2008/0088543 A1 | 4/2008 | Shibusawa |
| 2008/0179547 A1 | 7/2008 | Henley |
| 2008/0200010 A1* | 8/2008 | Endo et al. ................... 438/458 |
| 2008/0286937 A1 | 11/2008 | Mitani |
| 2009/0081850 A1* | 3/2009 | Ohnuma et al. ............. 438/458 |
| 2009/0239354 A1 | 9/2009 | Suzawa et al. |

FOREIGN PATENT DOCUMENTS

| | | |
|---|---|---|
| JP | 2000-124092 | 4/2000 |
| JP | 2002-170942 | 6/2002 |
| JP | 2005-252244 | 9/2005 |

* cited by examiner

FIG. 1B
FIG. 1A-1
FIG. 1A-2
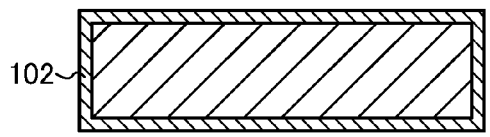
FIG. 1A-3
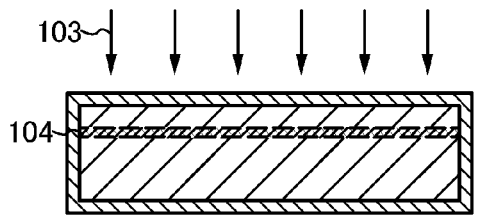
FIG. 1C
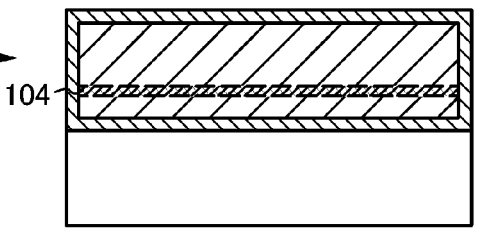
FIG. 1D
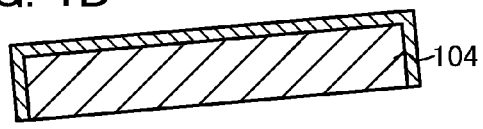
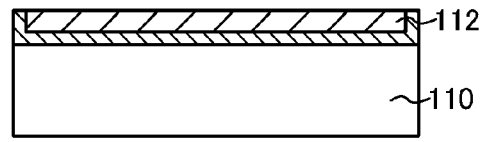

METHOD FOR MANUFACTURING SEMICONDUCTOR SUBSTRATE

BACKGROUND OF THE INVENTION

1. Field of the Invention

The present invention relates to a method for manufacturing an SOI substrate having a so-called silicon-on-insulator (SOI) structure in which a single crystal semiconductor layer is provided on an insulating surface, and a method for manufacturing a semiconductor device having the SOI structure.

2. Description of the Related Art

Integrated circuits in which a semiconductor substrate called a silicon-on-insulator (hereinafter also referred to as "SOI") having a thin single crystal semiconductor layer on an insulating surface is used instead of a silicon wafer which is manufactured by thinly slicing a single crystal semiconductor ingot have been developed. The integrated circuits using an SOI substrate have attracted attention as integrated circuits with reduced parasitic capacitance between a drain of a transistor and a substrate and improved performance of semiconductor integrated circuits.

As a method for manufacturing an SOI substrate, a hydrogen ion implantation separation method is known (for example, see Patent Document 1). The hydrogen ion implantation separation method is a method in which hydrogen ions are implanted into a silicon wafer to form an embrittled region at a predetermined depth from the surface, and the silicon wafer in which the embrittled region is formed is bonded to the other silicon wafer. Next, heat treatment is performed to cause separation along the embrittled region so that a thin silicon layer is formed on the other silicon wafer. Further, it is necessary to perform heat treatment in an oxidizing atmosphere, form an oxide film on the silicon layer, remove the oxide film, and perform heat treatment at 1000° C. to 1300° C. in order to increase bonding strength.

In addition, a method for forming a single crystal silicon layer over a base substrate made of glass by such a Smart Cut (registered trademark) method has been proposed (for example, see Patent Document 2).

The silicon layer formed in such a manner is in a state where crystal defects remain on a surface of and in the silicon layer due to the ion irradiation step for forming the embrittled region and the separation step, and the planarity of the surface significantly deteriorates. Further, if separation is not smoothly conducted along the embrittled region, there arise problems such as a rough surface, variation in thickness, and generation of minute cracks of the silicon layer.

Removal of crystal defects of a silicon layer can be achieved by heating at a temperature of 1000° C. or higher; however, such a high temperature process cannot be utilized for removal of the crystal defects of the silicon layer which is attached to the glass substrate having a strain point of 700° C. or lower. Thus, as disclosed in Patent Document 3, there has been an attempt to irradiate a silicon layer with a laser beam to recrystallize the silicon layer, so that crystal quality of the silicon layer is improved (see Patent Document 3).

[Citation List]

[Patent Document 1] Japanese Published Patent Application No. 2000-124092

[Patent Document 2] Japanese Published Patent Application No. 2002-170942

[Patent Document 3] Japanese Published Patent Application No. 2005-252244

SUMMARY OF THE INVENTION

However, crystal defects or damage caused by separation remains on a surface of a silicon layer after a single crystal silicon substrate is separated. In order to remove crystal defects of a single crystal silicon layer in such a state, laser irradiation is performed; however, there has been a problem that crystal defects or damage is introduced into the single crystal silicon layer from the surface of the silicon layer. Further, there has also been a problem that unevenness is caused on the surface of the silicon layer when the silicon layer is melted and recrystallized.

In view of such problems, it is an object to provide a method for manufacturing an SOI substrate in which planarity of a single crystal semiconductor layer fixed to a base substrate can be improved and crystallinity thereof can be improved even when a substrate which has low heat resistance and is likely to bend, such as a glass substrate, is used as the base substrate. In addition, it is another object to provide a method for manufacturing a semiconductor device using such an SOI substrate.

In the method for manufacturing an SOI substrate according to the present invention, a surface of a single crystal semiconductor layer attached to a base substrate is subjected to etching treatment, the surface of the single crystal semiconductor layer is irradiated with a laser beam, and the surface of the single crystal semiconductor layer is subjected to plasma treatment. The specific structure of the present invention is described below.

One embodiment includes the steps of: forming an insulating film over a semiconductor substrate; forming an embrittled region in the semiconductor substrate by irradiating the semiconductor substrate with accelerated ions through the insulating film; disposing a surface of the semiconductor substrate and a surface of a base substrate opposite to each other and bonding the surface of the insulating film to the surface of the base substrate; forming a semiconductor layer over the base substrate with the insulating film interposed therebetween by causing separation along the embrittled region by performing heat treatment after the surface of the insulating film and the surface of the base substrate are bonded to each other; performing etching treatment on the semiconductor layer; irradiating the semiconductor layer subjected to the etching treatment with a laser beam; and irradiating the semiconductor layer irradiated with the laser beam with plasma.

One embodiment includes the steps of: forming an insulating film over a semiconductor substrate; forming an embrittled region in the semiconductor substrate by irradiating the semiconductor substrate with accelerated ions through the insulating film; disposing a surface of the semiconductor substrate and a surface of a base substrate opposite to each other and bonding the surface of the insulating film to the surface of the base substrate; forming a semiconductor layer over the base substrate with the insulating film interposed therebetween by causing separation along the embrittled region by performing heat treatment after the surface of the insulating film and the surface of the base substrate are bonded to each other; performing first etching treatment on the semiconductor layer; irradiating the semiconductor layer subjected to the first etching treatment with a laser beam; performing second etching treatment on the semiconductor layer irradiated with the laser beam; and irradiating the semiconductor layer subjected to the second etching treatment with plasma.

In this specification, a "single crystal" means a crystal in which, when a certain crystal axis is focused, the direction of the crystal axis is oriented in the same direction in any portion of a sample and which has no crystal grain boundaries between crystals. Note that, in this specification, the single crystal includes a crystal in which the direction of crystal axes is uniform and which has no grain boundaries as described above even when it includes a crystal defect or a dangling bond. Further, "re-single-crystallization of a single crystal semiconductor layer" means that a semiconductor layer having a single crystal structure obtains a single crystal structure again through a state which is different from the single crystal structure (for example, a liquid phase state). In addition, it can also be said that "re-single-crystallization of a single crystal semiconductor layer" means that a single crystal semiconductor layer is recrystallized to form a single crystal semiconductor layer.

In this specification, an embrittled region is a weakened region of a single crystal semiconductor substrate which is formed by irradiating the single crystal semiconductor substrate with an ion beam so that crystal defects are formed by ions.

This embrittled region is divided by generation of a crack or the like by heat treatment, so that a single crystal semiconductor layer can be separated from the single crystal semiconductor substrate.

A "semiconductor device" in this specification refers to devices in general which can operate by utilizing semiconductor characteristics, and a display device, a semiconductor circuit, and an electronic device are all included in the semiconductor device.

In addition, a "display device" in this specification includes a liquid crystal display device and a light emitting device. A liquid crystal display device includes a liquid crystal element, and a light emitting device includes a light emitting element. A light emitting element includes, in its scope, an element whose luminance is controlled by current or voltage, and specifically includes an inorganic electroluminescent (EL) element, an organic EL element, and the like.

By applying the present invention, crystal defects can be reduced and planarity can be improved even when a supporting substrate which has low heat resistance is used. Further, by employing such an SOI substrate, a semiconductor device with excellent characteristics can be manufactured.

BRIEF DESCRIPTION OF THE DRAWINGS

In the accompanying drawings:

FIGS. 1A-1 to 1A-3, 1B, 1C, and 1D are diagrams illustrating an example of a method for manufacturing an SOI substrate according to the present invention;

FIGS. 4A-1 to 4A-3, 4B-1 and 4B-2, 4C, and 4D are diagrams illustrating an example of a method for manufacturing an SOI substrate according to the present invention;

DETAILED DESCRIPTION OF THE INVENTION

Figure 2A:
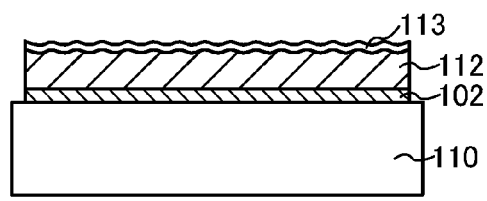
FIGS. 2A to 2F are diagrams illustrating an example of a method for manufacturing an SOI substrate according to the present invention.

Embodiments of the present invention will be described below with reference to the drawings. Note that the present invention is not limited to the following description, and it is easily understood by those skilled in the art that modes and details of the present invention can be modified in a variety of ways without departing from the purpose and scope of the present invention. Therefore, the present invention should not be construed as being limited to the following description of the embodiments. Note that in the structure of the present invention described below, reference numerals indicating the same portions and portions having a similar function are used in common in different drawings, and repeated descriptions thereof are omitted.

(Embodiment 1)

In this embodiment, an example of a method for manufacturing an SOI substrate will be described with reference to drawings. Specifically, steps in which a single crystal semiconductor layer is formed over a base substrate with an insulating layer interposed therebetween and planarity of the single crystal semiconductor layer is improved are described.

Figures 1, 4A:

First, a single crystal semiconductor substrate 100 and a base substrate 110 are prepared (see FIGS. 1A-1 and 1B).

As the single crystal semiconductor substrate 100, a commercially-available semiconductor substrate can be used. For example, a single crystal semiconductor substrate formed using an element belonging to Group 4, such as a single crystal silicon substrate, a single crystal germanium substrate, or a single crystal silicon germanium substrate, can be used. Alternatively, a compound semiconductor substrate formed of gallium arsenide, indium phosphide, or the like can be used. The size of a commercially-available silicon substrate is typically 5 inches (125 mm) in diameter, 6 inches (150 mm) in diameter, 8 inches (200 mm) in diameter, 12 inches (300 mm) in diameter, and 16 inches (400 mm) in diameter, and a typical shape thereof is a circular shape. Note that the shape of the single crystal semiconductor substrate 100 is not limited to a circular shape, and a single crystal semiconductor substrate processed into, for example, a rectangular shape or the like can also be used. Further, the single crystal semiconductor substrate 100 can be formed by a Czochralski (CZ) method or a Floating Zone (FZ) method. In the description given below, a case in which a single crystal silicon substrate which is formed by a CZ method is used as the single crystal semiconductor substrate 100 is described.

A substrate formed using an insulator can be used as the base substrate 110. Specific examples thereof are as follows:

a variety of glass substrates used in the electronics industry, such as substrates of aluminosilicate glass, aluminoborosilicate glass, and barium borosilicate glass; a quartz substrate; a ceramic substrate; and a sapphire substrate. Alternatively, a single crystal semiconductor substrate (for example, a single crystal silicon substrate or the like) can also be used as the base substrate 110. In this embodiment, a case of using a glass substrate is described. When a glass substrate which can be formed in large sizes and is inexpensive is used as the base substrate 110, cost reduction can be achieved.

Figures 1, 4B:
Figures 2, 4A:
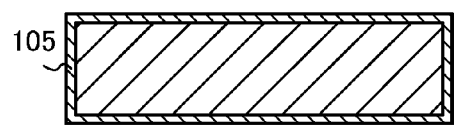
Figures 2, 4B:
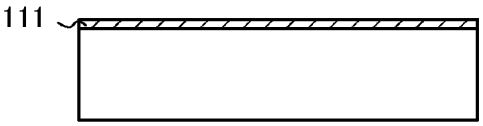

Next, an insulating film 102 is formed over the single crystal semiconductor substrate 100 (see FIG. 1A-2). As the insulating film 102, a single layer of an insulating layer such as a silicon oxide film, a silicon oxynitride film, a silicon nitride film, or a silicon nitride oxide film, or a stacked layer thereof can be formed. These films can be formed by a thermal oxidation method, a CVD method, a sputtering method, or the like.

In this specification, silicon oxynitride contains more oxygen than nitrogen and, in the case where measurements are performed using rutherford backscattering spectrometry (RBS) and hydrogen forward scattering (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide contains more nitrogen than oxygen, and in the case where measurements are performed using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Next, the single crystal semiconductor substrate is irradiated with ions through an insulating film to form an embrittled region 104 in the single crystal semiconductor substrate 100 (see FIG. 1A-3). The embrittled region 104 can be formed by irradiating the single crystal semiconductor substrate 100 with ions of hydrogen or the like having kinetic energy.

Then, the single crystal semiconductor substrate 100 and the base substrate 110 are attached (also referred to as "bonded") to each other with the insulating film 102 interposed therebetween (see FIG. 1C). After that, heat treatment is performed to cause separation (cleavage) along the embrittled region, so that a single crystal semiconductor layer 112 is provided over the base substrate 110 with the insulating film 102 interposed therebetween (see FIG. 1D). Note that the heat treatment is preferably performed at a temperature of less than or equal to the strain point of the base substrate 110.

By performing the heat treatment, internal pressure in microvoids formed in the embrittled region 104 increases due to increase in temperature. Due to the increase in pressure, the single crystal semiconductor substrate 100 is separated along the embrittled region 104. Because the insulating film 102 is bonded to the base substrate 110, the single crystal semiconductor layer 112 that is separated from the single crystal semiconductor substrate 100 is formed over the base substrate 110.

Figure 2B:
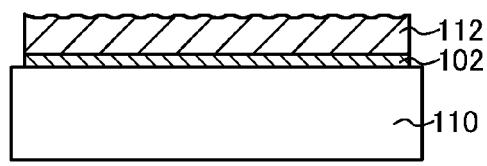

In general, after the cleavage, crystal defects and the like are generated in a superficial layer portion of the single crystal semiconductor layer 112 formed over the base substrate 110 due to formation of the embrittled region 104 and separation along the embrittled region, and the planarity deteriorates (see FIG. 2A). Further, a native oxide film 113 is formed on the superficial layer portion of the single crystal semiconductor layer 112. Contaminants are attached to a surface of the native oxide film 113. Thus, the native oxide film 113 formed on a surface of the single crystal semiconductor layer 112, crystal defects remaining in the superficial layer portion of the single crystal semiconductor layer 112, and the like are removed (see FIG. 2B).

The native oxide film 113, the crystal defects remaining in the superficial layer portion of the single crystal semiconductor layer 112, and the like are removed by etching treatment. The etching treatment is performed by either dry etching or wet etching, or a combination thereof. Alternatively, polishing treatment such as CMP may be performed instead of the etching treatment. Note that this etching treatment is also referred to as first etching treatment.

As the method of etching the native oxide film 113 and the single crystal semiconductor layer 112, a reactive ion etching (RIE) method, an inductively coupled plasma (ICP) etching method, an electron cyclotron resonance (ECR) etching method, a parallel plate (capacitive coupled) etching method, a magnetron plasma etching method, a dual-frequency plasma etching method, a helicon wave plasma etching method, or the like can be used, for example. Etching can be performed by using, for example, a chlorine-based gas such as $Cl_2$, $BCl_3$, or $SiCl_4$; a fluorine-based gas such as $CHF_3$, $CF_4$, $C_4F_8$, $C_2F_6$, $NF_3$, or sulfur fluoride; or a bromine-based gas such as HBr as an etching gas. Further, an inert gas such as He, Ar, or Xe, an $O_2$ gas, or an $H_2$ gas can be used. The etching treatment may be performed in a plurality of steps. Because the size or depth of defects in the single crystal semiconductor layer 112 depends on the amount of energy or dosage of ions which are added, the etching thickness of the single crystal semiconductor layer 112 which is removed by the etching treatment may be set as appropriate depending on the thickness and surface roughness of the single crystal semiconductor layer 112 before the etching treatment.

In the above-described manner, removal of the crystal defects of the single crystal semiconductor layer 112 and the like and planarization of the single crystal semiconductor layer 112 can be achieved by removing the superficial layer portion of the single crystal semiconductor layer 112 formed over the base substrate 110.

Figure 2C:
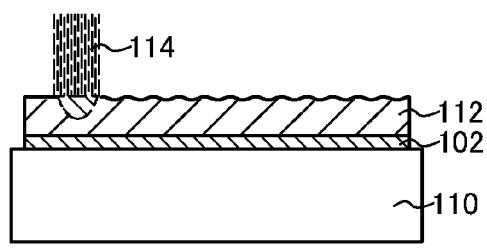

Next, the single crystal semiconductor layer 112 from which the superficial layer portion is removed is irradiated with a laser beam 114 (see FIG. 2C). There are crystal defects generated inside the single crystal semiconductor layer 112 due to the ion irradiation step for forming the embrittled region 104. The irradiation with the laser beam 114 is performed from the separation surface side of the single crystal semiconductor layer 112 or the base substrate 110 side in order to melt the single crystal semiconductor layer 112, so that improvements in crystallinity and planarity are achieved. The single crystal semiconductor layer 112 is partially melted or completely melted by irradiation with the laser beam 114.

It is preferable that the single crystal semiconductor layer 112 be partially melted by the irradiation with the laser beam 114. By partial melting of the single crystal semiconductor layer, crystal growth proceeds from a non-melted solid phase part. Accordingly, crystal defects can be repaired without reduction in crystallinity. Note that in this specification, "partial melting" means that a part (for example, an upper layer portion) of the single crystal semiconductor layer is melted into a liquid phase state, but another part (for example, a lower layer portion) is not melted and remains in a solid phase state. On the other hand, "complete melting" means that the single crystal semiconductor layer is melted into a liquid phase state down to the vicinity of its lower interface.

The single crystal semiconductor layer 112 is scanned with the laser beam 114 while the single crystal semiconductor layer 112 is partially melted, so that crystal growth proceeds from a non-melted solid phase part. Accordingly, crystal defects in the single crystal semiconductor layer 112 can be reduced and crystallinity can be improved. A part which is not melted is a single crystal and crystal orientations are aligned; thus, crystal grain boundaries are not formed, and the single crystal semiconductor layer 112 after the irradiation with the laser beam 114 can be a single crystal semiconductor layer without crystal grain boundaries. Moreover, a melted region is recrystallized by solidification, and a single crystal semiconductor which is adjacent to the melted region and which is not melted and a single crystal semiconductor which has aligned crystal orientations are formed. Therefore, in the case where single crystal silicon whose plane orientation of a main surface is (100) is used as the single crystal semiconductor substrate 100, the plane orientation of a main surface of the single crystal semiconductor layer 112 is (100), and the plane orientation of the main surface of the single crystal semiconductor layer 112 which is melted by the irradiation with the laser beam 114 and recrystallized is (100). Further, RTA or flash lamp irradiation may be performed instead of the irradiation with the laser beam 114.

In such a manner, by the irradiation with the laser beam 114 after removal of a superficial layer portion of a separation surface of the single crystal semiconductor layer, crystal defects, contaminants, and the like can be prevented from being introduced into the single crystal semiconductor layer. Further, by removal of the native oxide film, surface roughness due to the irradiation with the laser beam 114 can be prevented.

Figure 2D:
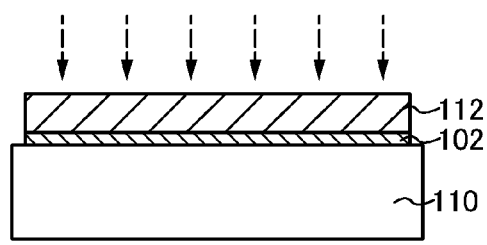
Figure 2E:
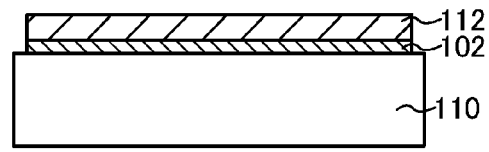
Figure 2F:
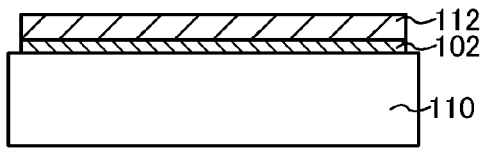

Next, plasma treatment is performed for planarization of the single crystal semiconductor layer 112 (see FIG. 2D).

Here, plasma treatment is performed on a treatment surface (here, the single crystal semiconductor layer 112) is performed by introducing an inert gas (such as an Ar gas) into a chamber in a vacuum state and applying a bias voltage to create a plasma state. Electrons and Ar cations are present in plasma, and Ar cations are accelerated in a cathode direction (to the single crystal semiconductor layer 112 side). The accelerated Ar cations collide with the surface of the single crystal semiconductor layer 112, so that the surface of the single crystal semiconductor layer 112 is sputter etched. At this time, a projection of the surface of the single crystal semiconductor layer 112 is preferentially sputter etched, so that planarity of the surface of the single crystal semiconductor layer 112 can be improved. Further, impurities such as organic substances on the surface of the single crystal semiconductor layer 112 can be removed by the accelerated Ar cations. Alternatively, plasma treatment can also be performed by introducing a reactive gas (such as an $O_2$ gas or an $N_2$ gas) in addition to the inert gas into a chamber in a vacuum state and applying a bias voltage to a treatment surface to create a plasma state. In the case of introducing the reactive gas, defects generated by the sputter etching performed on the surface of the single crystal semiconductor layer 112 can be repaired.

Figure 5:
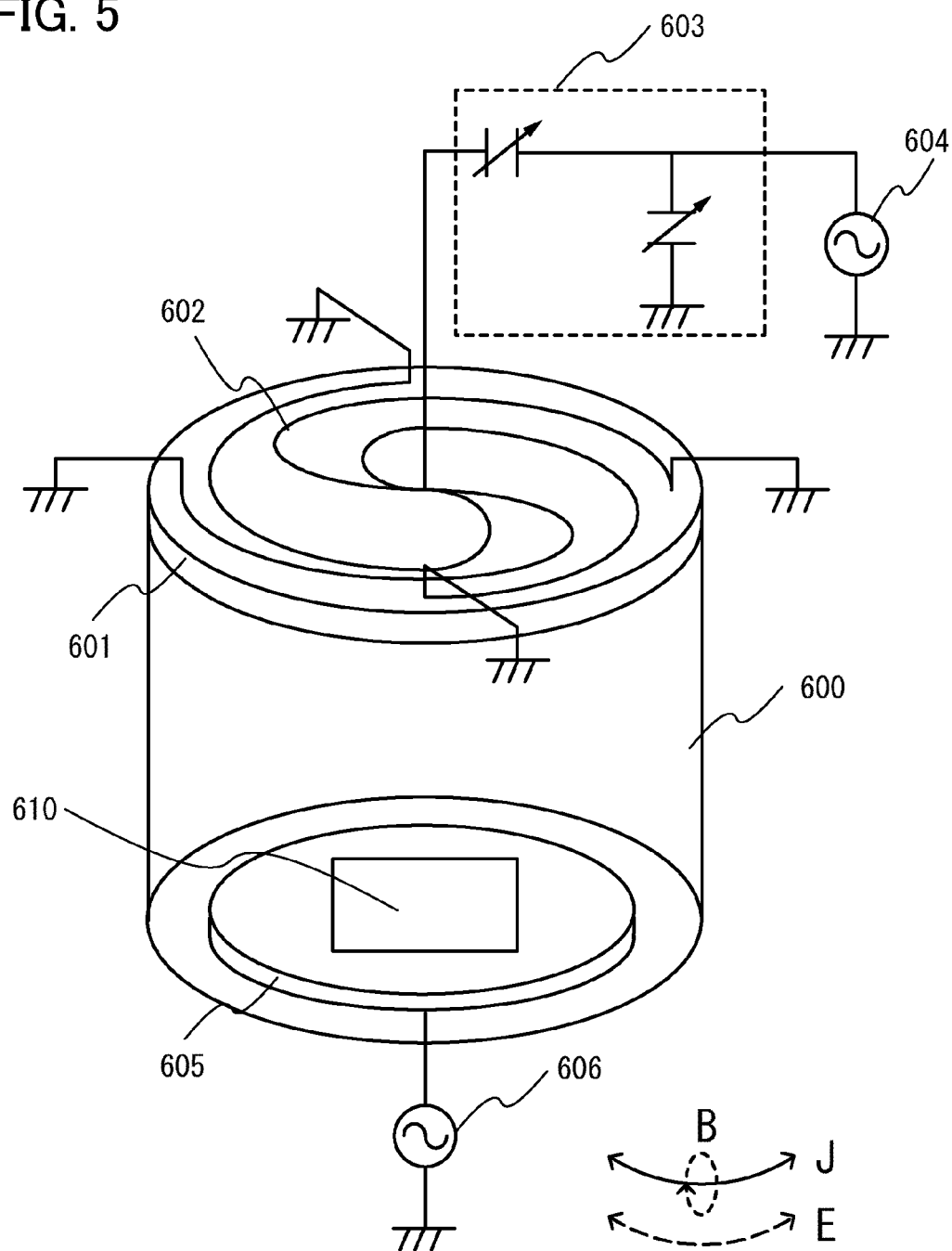
FIG. 5 is a diagram illustrating an example of plasma treatment in a method for manufacturing an SOI substrate according to the present invention.

In this embodiment, plasma treatment is performed using an argon gas by an inductively coupled plasma (ICP) method. FIG. 5 is a simplified structural diagram of a plasma treatment apparatus. A multi-spiral coil 602 is provided over a quartz plate 601 in an upper portion of a chamber 600, and is connected to an RF power source 604 with a matching box 603 interposed therebetween. Further, a lower electrode 605 on a substrate 610 (here, the single crystal semiconductor layer 112 formed over the base substrate) side which faces the multi-spiral coil 602 is connected to an RF power source 606. When an RF current is applied to the multi-spiral coil 602 over the substrate 610, an RF current J flows through the multi-spiral coil 602 in a direction θ, so that a magnetic field B is produced in a direction Z. Note that in the formula, $\mu_0$ represents the magnetic susceptibility.

$$\mu_0 J = r o t B$$

An induction field E is produced in the direction θ by the Faraday's law of electromagnetic induction.

$$-\frac{\partial B}{\partial t} = rotE$$

Electrons are accelerated in the direction θ with this induction field E, and collide with molecules of the gas, so that plasma is produced. A plasma region in which plasma with a high density spreads in a sheet-like form between electrodes can be obtained because the magnetic field B is hardly produced on the substrate 610 side. Cations are accelerated with a bias voltage applied to the substrate 610 side, and collide with the substrate 610.

In such a manner, the average surface roughness (Ra) and the maximum peak-to-valley height (P-V) on the surface of the single crystal semiconductor layer can be reduced.

Note that plasma treatment may be specifically performed using an Ar gas under conditions with an ICP power of 100 W to 3000 W, a pressure of 0.1 Pa to 5.0 Pa, a gas flow rate of 5 sccm to 300 sccm, and an RF bias voltage of 75 W to 300 W. More specifically, plasma treatment may be performed under conditions with an ICP power of 500 W (0.11 W/cm$^2$), a pressure of 1.35 Pa, a gas flow rate of 100 sccm, and an RF bias voltage of 100 W (0.61 W/cm$^2$).

Here, a thinning step may be performed to reduce the thickness of the single crystal semiconductor layer 112 (see FIG. 2D). By performing the thinning step, the single crystal semiconductor layer 112 can have an optimal thickness for a semiconductor element to be formed later. Further, even if plasma damage is caused to the single crystal semiconductor layer 112 due to the plasma treatment, the plasma damage can be removed by the thinning step. The thinning of the single crystal semiconductor layer 112 can be performed in a manner similar to that of the first etching treatment (see FIG. 2B). For example, in the case where the single crystal semiconductor layer 112 is formed of silicon, the thickness of the single crystal semiconductor layer 112 can be reduced by dry etching using $SF_6$ and $O_2$ as process gases. By this etching, the single crystal semiconductor layer is preferably thinned to a thickness of greater than or equal to 5 nm and less than or equal to 100 nm, more preferably greater than or equal to 5 nm and less than or equal to 50 nm. Note that this etching treatment is also referred to as second etching treatment.

After the thinning treatment, heat treatment is preferably performed on the single crystal semiconductor layer 112 at 500° C. to 700° C., inclusive. By such heat treatment, crystal defects of the single crystal semiconductor layer 112, which have not been removed by the irradiation with the laser beam 114, can be eliminated and distortion of the single crystal semiconductor layer 112 can be reduced. The heat treatment can be performed using a rapid thermal annealing (RTA) apparatus, a resistance heating furnace, or a microwave heating apparatus. As an RTA apparatus, a gas rapid thermal annealing (GRTA) apparatus or a lamp rapid thermal annealing (LRTA) apparatus can be used. For example, when a resistance heating furnace is used, heat treatment may be performed at 550° C. for four hours.

Through the above steps, the SOI substrate can be manufactured.

Through the above steps, the SOI substrate in which the single crystal semiconductor layer 112 is provided over the base substrate 110 with the insulating film 102 interposed therebetween can be manufactured. By using the manufacturing method described in this embodiment, a semiconductor substrate which has the single crystal semiconductor layer 112 with reduced crystal defects and favorable planarity can be provided. By using such an SOI substrate, a semiconductor element with excellent characteristics can be formed.

Note that a case where plasma treatment is performed after laser irradiation is described in FIGS. 2A to 2F; however, the present invention is not limited to this. For example, the method shown in FIGS. 3A to 3F can also be used.

FIGS. 3A to 3F show a case where a thinning step (the second etching treatment) is performed after laser irradiation and plasma treatment is performed after the thinning step.

Figure 3A:
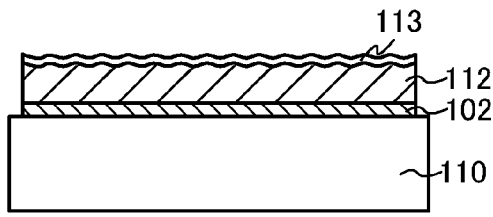
FIGS. 3A to 3F are diagrams illustrating an example of a method for manufacturing an SOI substrate according to the present invention.
Figure 3B:
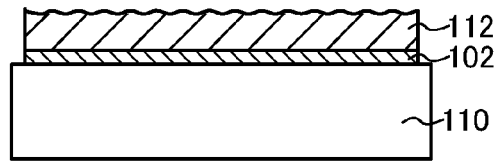
Figure 3C:
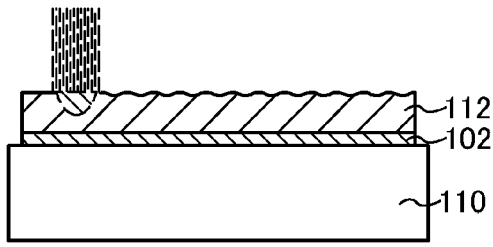
Figure 3D:
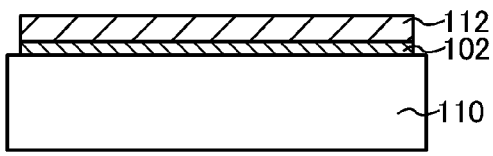

FIG. 3A shows the single crystal semiconductor layer 112 over the base substrate 110, which is separated from the single crystal semiconductor substrate 100 and is formed over the base substrate 110. As shown in FIG. 3B, etching treatment is performed on the single crystal semiconductor layer 112, and as shown in FIG. 3C, the single crystal semiconductor layer 112 subjected to the etching treatment is irradiated with a laser beam. The steps shown in FIGS. 3B and 3C can be performed in a manner similar to the steps shown in FIGS. 2B and 2C; thus, detailed explanations thereof are omitted.

Figure 3E:
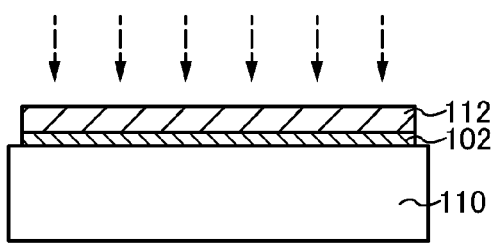
Figure 3F:
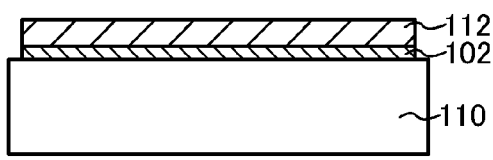

Next, a thinning step is performed on the single crystal semiconductor layer 112 (see FIG. 3D) and then plasma treatment is performed on the single crystal semiconductor layer 112 subjected to the thinning step (see FIG. 3E). Further, heat treatment may be performed on the single crystal semiconductor layer 112 subjected to the plasma treatment (see FIG. 3F). The heat treatment can be performed in a manner similar to the heat treatment shown in FIG. 2F. The thinning step shown in FIG. 3D can be performed in a manner similar to the thinning step shown in FIG. 2E, the plasma treatment shown in FIG. 3E can be performed in a manner similar to the plasma treatment shown in FIG. 2D, and the heat treatment shown in FIG. 3F can be performed in a manner similar to the heat treatment shown in FIG. 2F; thus, detailed explanations thereof are omitted.

The plasma treatment is performed after the thinning step so that unevenness which exists in the single crystal semiconductor layer 112 can be planarized. Further, even if plasma damage is caused due to the plasma treatment, the plasma damage can be repaired by the heat treatment performed after the plasma treatment.

In such a manner, by applying the present invention, crystal defects of the single crystal semiconductor layer can be reduced and planarity can be improved even when a supporting substrate with low heat resistance is used.

Note that the structure described in this embodiment can be appropriately combined with structures described in other embodiments of this specification.

(Embodiment 2)

In this embodiment, bonding of the single crystal semiconductor substrate 100 and the base substrate 110 will be described in detail below with reference to drawings.

First, the single crystal semiconductor substrate 100 is prepared (see FIG. 4A-1). It is preferable that a surface of the single crystal semiconductor substrate 100 be appropriately cleaned in advance with a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), or the like in light of removal of contamination. Dilute hydrofluoric acid and ozone water may be discharged alternately for cleaning.

Next, an oxide film 105 is formed on the surface of the single crystal semiconductor substrate 100 (see FIG. 4A-2). As the oxide film 105, for example, a single layer of a silicon oxide film, a silicon oxynitride film, or the like, or a stacked layer thereof can be used. These films can be formed by a thermal oxidation method, a CVD method, a sputtering method, or the like. Further, in the case where the oxide film 105 is formed by a CVD method, it is preferable that a silicon oxide film which is formed using organosilane such as tetraethoxysilane (abbreviation: TEOS) (chemical formula: $Si(OC_2H_5)_4$) be used as the oxide film 105 in light of productivity.

In this embodiment mode, the single crystal semiconductor substrate 100 is subjected to thermal oxidation treatment to form an oxide film 105 (here, an $SiO_x$ film) (see FIG. 4A-2). The thermal oxidation treatment is preferably performed in an oxidizing atmosphere to which a halogen is added.

For example, the single crystal semiconductor substrate 100 is subjected to thermal oxidation treatment in an oxidizing atmosphere into which chlorine (Cl) is introduced, thereby forming the oxide film 105. In this case, the oxide film 105 contains chlorine atoms.

The chlorine atoms contained in the oxide film 105 form distortions. As a result, absorption of moisture into the oxide film 105 is improved and diffusion rate is increased. That is, when moisture is present on a surface of the oxide film 105, the moisture present on the surface of the oxide film 105 can be rapidly absorbed and diffused into the oxide film 105.

As an example of thermal oxidation treatment, thermal oxidation can be performed in an oxidizing atmosphere which contains hydrogen chloride (HCl) at a proportion of 0.5 vol. % to 10 vol. % (preferably, 2 vol. %) with respect to oxygen at a temperature of 900° C. to 1150° C. (preferably, 1000° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm.

In this embodiment, the concentration of chlorine atoms contained in the oxide film 105 is controlled to $1 \times 10^{17}$ atoms/$cm^3$ to $1 \times 10^{21}$ atoms/$cm^3$. The inclusion of chlorine atoms in the oxide film 105 is effective in preventing contamination of the single crystal semiconductor substrate 100 by trapping heavy metal (such as Fe, Cr, Ni, Mo, and the like) which is an extrinsic impurity.

The inclusion of halogen such as chlorine in the oxide film 105 by HCl oxidation or the like makes it possible to perform gettering on an impurity (for example, movable ions such as Na) which gives an adverse effect on the single crystal semiconductor substrate 100. That is, by heat treatment which is performed after the oxide film 105 is formed, the impurity contained in the single crystal semiconductor substrate is separated out to the oxide film 105 and captured by reacting with the halogen (for example, chlorine). Accordingly, the impurity trapped in the oxide film 105 can be fixed and prevented from contaminating the single crystal semiconductor substrate 100. In addition, when the oxide film 105 is bonded to a glass substrate, the oxide film 105 can also function as a film for fixing an impurity, such as Na, contained in glass.

Specifically, the inclusion of halogen, such as chlorine, in the oxide film 105 by HCl oxidation or the like is effective in removing contamination of the semiconductor substrate when cleaning of the semiconductor substrate is insufficient or when the semiconductor substrate is repeatedly reused.

Further, halogen atoms to be contained in the oxide film 105 are not limited to chlorine atoms. The oxide film 105 may contain fluorine atoms. The surface of the single crystal semiconductor substrate 100 may be oxidized with fluorine by thermal oxidation treatment in an oxidizing atmosphere after immersion of the surface of the single crystal semiconductor substrate 100 into a DHF solution or by thermal oxidation treatment in an oxidizing atmosphere to which $NF_3$ is added.

Figures 3, 4A:
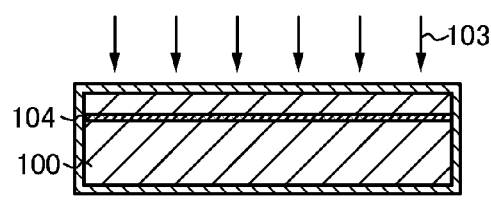

Next, the single crystal semiconductor substrate 100 is irradiated with ions having kinetic energy to form the embrittled region 104 having a damaged crystal structure at a predetermined depth in the single crystal semiconductor substrate 100 (see FIG. 4A-3). As illustrated in FIG. 4A-3, by irradiation of the single crystal semiconductor substrate 100 with accelerated ions 103 through the oxide film 105, the ions 103 are added to a region at a predetermined depth from the surface of the single crystal semiconductor substrate 100, whereby the embrittled region 104 can be formed. The ions 103 are obtained as follows: a source gas is excited to generate plasma of the source gas and ions are extracted from plasma of the source gas and are then accelerated.

The depth of a region where the embrittled region 104 is formed can be adjusted by kinetic energy, mass, charge, and incident angle of the ions 103. Kinetic energy can be adjusted by acceleration voltage, dosage, or the like. The embrittled region 104 is formed at a depth equal to or substantially equal to the average penetration depth of the ions 103. Thus, the thickness of the single crystal semiconductor layer separated from the single crystal semiconductor substrate 100 is determined by the average penetration depth of the ions 103. The depth at which the embrittled region 104 is formed is adjusted such that the thickness of this single crystal semiconductor layer is greater than or equal to 10 nm and less than or equal to 500 nm, preferably, greater than or equal to 50 nm and less than or equal to 200 nm.

Main components of an ion doping apparatus are as follows: a chamber in which a treatment object is placed; an ion source for generating desired ions; and an acceleration mechanism for acceleration of ions for irradiation therewith. The ion source includes a gas supply device for supplying a source gas to generate desired ion species, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions that are generated from the ion source are accelerated. Note that components of the ion doping apparatus are not limited to the components described above and an as-needed mechanism may be provided.

In this embodiment, hydrogen is added to the single crystal semiconductor substrate 100 with an ion doping apparatus. A hydrogen-containing gas is supplied as a plasma source gas. For example, $H_2$ is supplied. A hydrogen gas is excited to generate plasma; ions included in plasma are accelerated without mass separation; and the single crystal semiconductor substrate 100 is irradiated with the accelerated ions.

In an ion doping apparatus, the percentage of $H_3^+$ to the total amount of ion species ($H^+$, $H_2^+$, and $H_3^+$) that are generated from a hydrogen gas is set to 50% or higher. Preferably, the percentage of $H_3^+$ is set to 80% or higher. Because an ion doping apparatus does not involve mass separation, the percentage of one kind ($H_3^-$) to plural kinds of ion species that are generated in plasma is preferably 50% or higher, more preferably, 80% or higher. By irradiation with ions having the same mass, ions can be added in a concentrated manner to the same depth in the single crystal semiconductor substrate 100.

In order to form the embrittled region 104 in a shallow region, the acceleration voltage for the ions 103 needs to be low. With an increase in the percentage of $H_3^+$ ions in plasma, atomic hydrogen (H) can be efficiently added to the single crystal semiconductor substrate 100. Because the mass of an $H_3^+$ ion is three times as large as that of an $H^-$ ion, when one hydrogen atom is added to the same depth, the acceleration voltage for an $H_3^+$ ion can be three times as high as that of an $H^+$ ion. When the acceleration voltage for ions can be increased, a takt time for ion irradiation treatment can be shortened and productivity and throughput can be improved.

Because ion doping apparatuses are inexpensive and excellent for use in large-area treatment, by irradiation with $H_3^+$ by use of such an ion doping apparatus, significant effects such as an improvement in semiconductor characteristics, an increase in area, a reduction in costs, and an improvement in production efficiency can be obtained. Further, in the case where an ion doping apparatus is used, heavy metals may also be introduced together with $H_3^+$; however, by irradiation with ions through the oxide film 105 containing chlorine atoms, the single crystal semiconductor substrate 100 can be prevented from being contaminated due to these heavy metals as described above.

Note that the step of irradiating the single crystal semiconductor substrate 100 with the accelerated ions 103 can also be performed with an ion implantation apparatus. An ion implantation apparatus is a mass-separation apparatus with which a treatment object, which is placed in a chamber, is irradiated with an ion species having a specific mass after mass separation of plural kinds of ion species generated by excitation of a source gas into plasma. Thus, in the case of using an ion implantation apparatus, $H^+$ ions and $H_2^+$ ions that are generated by excitation of a hydrogen gas and $PH_3$ are subjected to mass separation, and either $H^+$ ions or $H_2^+$ ions are accelerated, with which the single crystal semiconductor substrate 100 is irradiated.

Next, a base substrate 110 is prepared (see FIG. 4B-1). As the base substrate 110, a substrate made from an insulator is used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. In this embodiment, a case is described in which a glass substrate is used. When a glass substrate which can be manufactured in a large size and is inexpensive is used as the base substrate 110, cost reduction can be achieved.

Before the base substrate 110 is used, it is preferable that a surface of the base substrate 110 be cleaned in advance. Specifically, the base substrate 110 is subjected to ultrasonic cleaning using a hydrochloric acid/hydrogen peroxide mixture (HPM), a sulfuric acid/hydrogen peroxide mixture (SPM), an ammonium hydroxide/hydrogen peroxide mixture (APM), dilute hydrofluoric acid (DHF), or the like. For example, it is preferable that the surface of the base substrate 110 be subjected to ultrasonic cleaning using a hydrochloric acid/hydrogen peroxide mixture. By such cleaning treatment, the surface of the base substrate 110 can be planarized and residual abrasive particles can be removed.

Next, a nitrogen-containing layer 111 (for example, an insulating film including nitrogen such as a silicon nitride film ($SiN_x$) or a silicon nitride oxide film ($SiN_xO_y$) (x>y)) is formed over the surface of the base substrate 110 (see FIG. 4B-2).

In this embodiment, the nitrogen-containing layer 111 functions as a layer (a bonding layer) bonded to the oxide film 105 provided on the single crystal semiconductor substrate 100. In addition, when a single crystal semiconductor layer having a single crystal structure is provided over the base substrate later, the nitrogen-containing layer 111 also functions as a barrier layer for preventing impurities such as Na (sodium) contained in the base substrate from diffusing into the single crystal semiconductor layer.

Because the nitrogen-containing layer 111 functions as a bonding layer, it is preferable that the nitrogen-containing layer 111 have a smooth surface in order to suppress defective bonding. Specifically, it is preferable that the nitrogen-containing layer 111 be formed to have a surface with an average surface roughness (Ra) of 0.5 nm or less and a root-mean-square surface roughness (Rms) of 0.60 nm or less, more preferably, an average surface roughness of 0.35 nm or less and a root-mean-square surface roughness of 0.45 nm or less. The thickness is preferably in the range of 10 nm to 200 nm, inclusive, more preferably, 50 nm to 100 nm, inclusive.

Figure 4C:
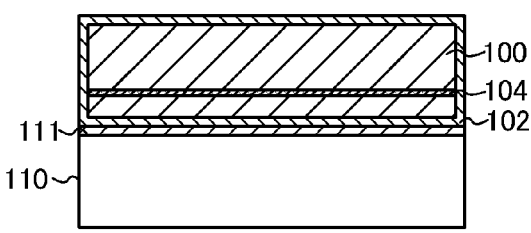

Next, the surface of the single crystal semiconductor substrate 100 and the surface of the base substrate 110 are disposed opposite to each other, and the surface of the oxide film 105 and a surface of the nitrogen-containing layer 111 are bonded to each other (see FIG. 4C).

Here, after the single crystal semiconductor substrate 100 and the base substrate 110 are disposed in contact with each other with the oxide film 105 and the nitrogen-containing layer 111 interposed therebetween, a pressure of about 1 $N/cm^2$ to 500 $N/cm^2$, preferably, 1 $N/cm^2$ to 20 $N/cm^2$ is applied to a portion of the single crystal semiconductor substrate 100. From the portion where pressure is applied, the oxide film 105 and the nitrogen-containing layer 111 start to bond to each other and spontaneous bonding occurs and extends to the entire area. This bonding step is performed by the action of van der Waals force or hydrogen bonding and can be performed at room temperature without heat treatment. Thus, a substrate having a low heat resistance, such as a glass substrate, can be used as the base substrate 110.

Note that, before the single crystal semiconductor substrate 100 and the base substrate 110 are bonded to each other, at least one of the oxide film 105 formed on the single crystal semiconductor substrate 100 and the nitrogen-containing layer 111 formed over the base substrate 110 is preferably subjected to surface treatment.

As the surface treatment, plasma treatment, ozone treatment, megasonic cleaning, or two fluid cleaning (a method for spraying functional water such as pure water or hydrogen-containing water with a carrier gas such as nitrogen), or a combination thereof can be performed. In particular, after plasma treatment is performed on at least one of the surface of the oxide film 105 and the surface of the nitrogen-containing layer 111, ozone treatment, megasonic cleaning, two fluid cleaning, or the like is performed on the single crystal semiconductor substrate 100 and the base substrate 110, so that dust such as organic substances on treatment surfaces can be removed and the surfaces can be made hydrophilic. As a result, bonding strength between the oxide film 105 and the nitrogen-containing layer 111 can be improved. Here, plasma treatment is performed using an inert gas (for example, an argon (Ar) gas) and/or a reactive gas (for example, an oxygen ($O_2$) gas or a nitrogen ($N_2$) gas) by an RIE method, an ICP method, or atmospheric pressure plasma.

Here, an example of ozone treatment is described. For example, ozone treatment can be performed on a surface of a treatment object by irradiation with ultraviolet (UV) rays in an atmosphere containing oxygen. Ozone treatment in which irradiation with ultraviolet rays is performed in an atmosphere containing oxygen is also referred to as UV ozone treatment, ultraviolet ozone treatment, or the like. In an atmosphere containing oxygen, irradiation with ultraviolet light having a wavelength of less than 200 nm and ultraviolet light having a wavelength of greater than or equal to 200 nm of ultraviolet rays is performed, so that ozone can be generated and singlet oxygen can be generated from the ozone. Irradiation with ultraviolet light having a wavelength of less than 180 nm in ultraviolet rays is performed, so that ozone can be generated and singlet oxygen can also be generated from the ozone.

Examples of reactions which occur by performing irradiation with ultraviolet light having a wavelength of less than 200 nm and ultraviolet light having a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with ultraviolet light (h$\nu$) having a wavelength ($\lambda_1$ nm) of less than 200 nm in an atmosphere containing oxygen ($O_2$) is performed to generate oxygen atoms ($O(^3P)$) in a ground state. Next, in the reaction formula (2), the oxygen atoms ($O(^3P)$) in a ground state and oxygen ($O_2$) are reacted with each other to generate ozone ($O_3$). Then, in the reaction formula (3), irradiation with ultraviolet light having a wavelength ($\lambda_2$ nm) of greater than or equal to 200 nm in an atmosphere containing the generated ozone ($O_3$) is performed to generate singlet oxygen $O(^1D)$ in an excited state. In an atmosphere containing oxygen, irradiation with ultraviolet light having a wavelength of less than 200 nm of ultraviolet rays is performed to generate ozone while irradiation with ultraviolet light having a wavelength of greater than or equal to 200 nm of ultraviolet rays is performed to generate singlet oxygen by decomposing ozone. The ozone treatment as described above can be performed, for example, by irradiation with light of a low-pressure mercury lamp ($\lambda_1$=185 nm, $\lambda_2$=254 nm) in an atmosphere containing oxygen.

In addition, examples of reactions which are caused by performing irradiation with ultraviolet light having a wavelength of less than 180 nm in an atmosphere containing oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and oxygen atoms ($O(^3P)$) in a ground state. Next, in the reaction formula (5), the oxygen atoms ($O(^3P)$) in a ground state and oxygen ($O_2$) are reacted with each other to generate ozone ($O_3$). In the reaction formula (6), irradiation with ultraviolet light having a wavelength ($\lambda_3$ nm) of less than 180 nm in an atmosphere containing the generated ozone ($O_3$) is performed to generate singlet oxygen in an excited state and oxygen. In an atmosphere containing oxygen, irradiation with ultraviolet light having a wavelength of less than 180 nm of ultraviolet rays is performed to generate ozone and to generate singlet oxygen by decomposing the ozone or oxygen. The ozone treatment as described above can be performed, for example, by irradiation with light of an Xe excimer UV lamp ($\lambda_3$=172 nm) in an atmosphere containing oxygen.

Chemical bonding of an organic substance attached to a surface of a treatment object is cut by ultraviolet light having a wavelength of less than 200 nm, so that the organic substance attached to the surface of the treatment object or the organic substance whose chemical bonding is cut can be removed by oxidative decomposition with ozone or singlet oxygen generated by ozone. By performing ozone treatment as described above, hydrophilicity and purity of the surface of the treatment object can be increased, and bonding can be favorably performed.

In an atmosphere containing oxygen, ozone is generated by performing irradiation with ultraviolet rays. Ozone is effective in removal of the organic substance attached to the surface of the treatment object. In addition, singlet oxygen is also effective in removal of the organic substance attached to the surface of the treatment object as much as or more than ozone. Ozone and singlet oxygen are examples of oxygen in an active state and are also collectively referred to as the active oxygen. As described with the above reaction formulae and the like, because there are reactions where ozone is generated in generating singlet oxygen or singlet oxygen is generated by ozone, here, such reactions including a reaction where singlet oxygen contributes are referred to as the ozone treatment for convenience.

In addition, after the oxide film 105 is bonded to the nitrogen-containing layer 111, heat treatment is preferably performed in order to increase bonding strength. This heat treatment is performed at a temperature where a crack is not generated in the embrittled region 104, for example, at a temperature in the range of greater than or equal to a room temperature and less than 400° C. The oxide film 105 may be bonded to the nitrogen-containing layer 111 during heating at a temperature within the above range. The heat treatment can be performed using a diffusion furnace, a heating furnace such as a resistance heating furnace, a rapid thermal annealing (RTA) apparatus, a microwave heating apparatus, or the like.

In general, when heat treatment is performed at the same time as or after bonding of the oxide film 105 and the nitrogen-containing layer 111, the dehydration reaction at the bonding interface proceeds and the bonding interfaces come close to each other; thus, bond is strengthened by strengthening of hydrogen bonding and formation of covalent bonding. In order to promote the dehydration reaction, moisture generated at the bonding interface through the dehydration reaction should be removed by heat treatment at high temperature. That is, when heat treatment after bonding is performed at low temperature, moisture generated at the bonding interface through the dehydration reaction cannot be removed effectively; thus, the dehydration reaction does not progress and there is a difficulty in improving bonding strength sufficiently.

On the other hand, in the case where an oxide film containing chlorine atoms or the like is used as the oxide film 105, the oxide film 105 can absorb and diffuse moisture. Thus, even when heat treatment after bonding is performed at low temperature, moisture generated at the bonding interface through the dehydration reaction can be absorbed and diffused into the oxide film 105, and the dehydration reaction can be promoted efficiently. In this case, even when a low heat-resistant substrate such as a glass substrate is used as the base substrate 110, the bonding strength between the oxide film 105 and the nitrogen-containing layer 111 can be sufficiently improved. Further, by performing plasma treatment by applying a bias voltage, moisture can be effectively absorbed and diffused into the oxide film 105. Accordingly, the bonding strength between the oxide film 105 and the nitrogen-containing layer 111 can be improved even when heat treatment is performed at low temperature.

Figure 4D:
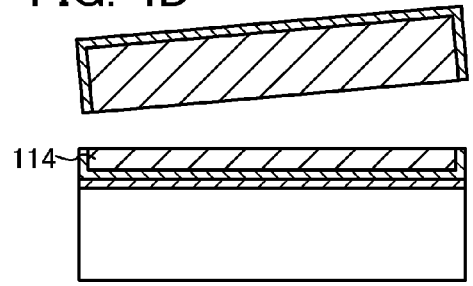

Next, heat treatment is performed to cause separation (cleavage) along the embrittled region 104, so that a single crystal semiconductor layer 112 is provided over the base substrate 110 with the oxide film 105 and the nitrogen-containing layer 111 interposed therebetween (see FIG. 4D).

By performing the heat treatment, internal pressure in microvoids formed in the embrittled region 104 increases due to increase in temperature. Due to the increase in pressure, the volume of the microvoids formed in the embrittled region 104 is changed and a crack is generated in the embrittled region 104, so that the single crystal semiconductor substrate 100 is cleaved along the embrittled region 104. Because the oxide film 105 is bonded to the base substrate 110, the single crystal semiconductor layer 112 that is separated from the single crystal semiconductor substrate 100 is formed over the base substrate 110. This heat treatment is performed at a temperature less than or equal to the strain point of the base substrate 110.

This heat treatment can be performed using a diffusion furnace, a heating furnace such as a resistance heating furnace, a rapid thermal annealing (RTA) apparatus, a microwave heating apparatus, or the like. For example, in the case of using an RTA apparatus, the heat treatment can be performed at a heating temperature of greater than or equal to 550° C. and less than or equal to 730° C. for greater than or equal to 0.5 min and less than or equal to 60 min.

Note that, by performing the heat treatment of FIG. 1D without performing the above-described heat treatment for increasing the bonding strength between the base substrate 110 and the oxide film 105, the heat treatment step for increasing the bonding strength between the oxide film 105 and the nitrogen-containing layer 111 and the heat treatment step for causing separation along the embrittled region 104 may be performed at the same time.

Through the above steps, an SOI substrate in which the single crystal semiconductor layer 112 is provided over the base substrate 110 with the oxide film 105 and the nitrogen-containing layer 111 interposed therebetween can be manufactured. By employing the manufacturing method described in this embodiment, even when the nitrogen-containing layer 111 is used as a bonding layer, the bonding strength between the base substrate 110 and the single crystal semiconductor layer 112 can be improved and reliability can be improved. As a result, an SOI substrate in which diffusion of impurities into the single crystal semiconductor layer 112 formed over the base substrate 110 is suppressed and the base substrate 110 and the single crystal semiconductor layer 112 are strongly attached to each other can be formed.

In addition, by providing the nitrogen-containing layer on the base substrate side and forming the oxide film containing halogen such as chlorine on the semiconductor substrate side, a manufacturing process can be simplified and the entry of impurity elements into the semiconductor substrate before the semiconductor substrate is bonded to the base substrate can be suppressed. Further, by forming the oxide film containing halogen such as chlorine as a bonding layer which is provided on the semiconductor substrate side, bonding strength can be improved by promoting the dehydrogenation reaction efficiently even when heat treatment after bonding is performed at low temperature.

After that, as described in Embodiment 1, the first etching treatment, laser irradiation, plasma treatment, the second etching treatment, and heat treatment are performed. These treatments may be performed in a manner similar to those shown in FIGS. 2A to 2F or FIGS. 3A to 3F.

Note that in this embodiment, a case where the oxide film 105 is formed on the single crystal semiconductor substrate 100 and the nitrogen-containing layer 111 is formed over the base substrate 110 is described; however, the present invention is not limited to this. For example, the oxide film 105 and the nitrogen-containing layer may be stacked in this order on the single crystal semiconductor substrate 100 and the surface of the nitrogen-containing layer formed over the oxide film 105 and the surface of the base substrate 110 may be bonded to each other. In this case, the nitrogen-containing layer may be provided before formation of the embrittled region 104 or may be provided after formation of the embrittled region 104. Alternatively, an oxide film (for example, silicon oxide) may be formed on the nitrogen-containing layer and the surface of the oxide film 105 and the surface of the base substrate 110 may be bonded to each other.

Further, if the entry of impurities from the base substrate 110 into the single crystal semiconductor layer 112 is not a problem, the surface of the oxide film 105 provided on the single crystal semiconductor substrate 100 and the surface of the base substrate 110 may be bonded to each other without providing the nitrogen-containing layer 111 over the base substrate 110.

Note that the structure described in this embodiment can be appropriately combined with structures described in other embodiments of this specification.

(Embodiment 3)

In this embodiment, a method for manufacturing an n-channel thin film transistor and a p-channel thin film transistor is described with reference to FIGS. 6A to 6E and FIGS. 7A to 7C as an example of a method for manufacturing a semiconductor device having a high-performance and highly-reliable semiconductor element, with high yield. By combination of a plurality of thin film transistors (TFTs), a variety of semiconductor devices can be manufactured. Note that repetitive descriptions for the same components as or components having similar functions to the components in Embodiments 1 and 2 are omitted.

Figure 6A:
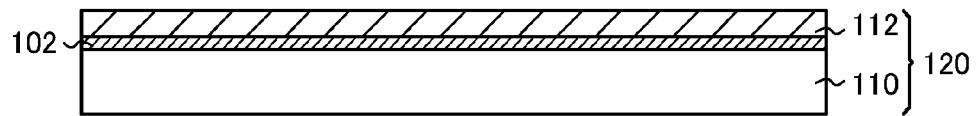
FIGS. 6A to 6E are diagrams illustrating an example of a semiconductor device using an SOI substrate according to the present invention.

In FIG. 6A, the insulating film 102 and the single crystal semiconductor layer 112 are formed over the base substrate 110. Note that here, an example in which a semiconductor substrate having a structure shown in FIG. 2D is employed; however, a semiconductor substrate having another structure described in this specification can also be employed.

The single crystal semiconductor layer 112 is separated from the single crystal semiconductor substrate 100. As described in Embodiment 1, the single crystal semiconductor layer 112 is irradiated with a laser beam after being etched, and then subjected to plasma etching, so that crystal defects in the single crystal semiconductor layer 112 can be reduced and planarity of the surface of the single crystal semiconductor layer 112 can be improved.

Figure 6B:
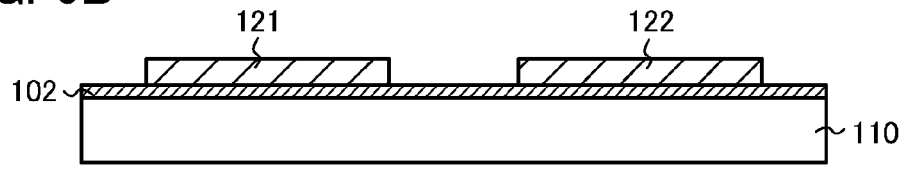

The single crystal semiconductor layer 112 is etched into island shapes to form separated single crystal semiconductor layers 121 and 122 in accordance with positions of semiconductor elements (see FIG. 6B).

Note that, before the single crystal semiconductor layer 112 is etched, it is preferable to add an impurity element such as boron, aluminum, or gallium or an impurity element such as phosphorus or arsenic to the single crystal semiconductor layer 112 in order to control the threshold voltage of TFTs. For example, an impurity element such as boron, aluminum, or gallium is added to a region where an n-channel TFT is to be formed, and an impurity element such as phosphorus or arsenic is added to a region where a p-channel TFT is to be formed.

The oxide film on the single crystal semiconductor layer is removed, and a gate insulating layer 123 which covers the single crystal semiconductor layers 121 and 122 is formed. The single crystal semiconductor layers 121 and 122 in this embodiment have high planarity. Thus, even if a gate insulating layer formed over the single crystal semiconductor layers 121 and 122 is a thin gate insulating layer, the gate insulating layer can cover the single crystal semiconductor layers 121 and 122 with favorable coverage. Therefore, characteristic defects due to a coverage defect of the gate insulating layer can be prevented, and a semiconductor device with high reliability can be manufactured with high yield.

The gate insulating layer 123 may be formed using silicon oxide, or may be formed with a stacked structure of silicon oxide and silicon nitride. The gate insulating layer 123 may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and has excellent reliability.

Further, as the gate insulating layer 123, a high dielectric constant material such as zirconium oxide, hafnium oxide, titanium oxide, or tantalum oxide may be used. When a high dielectric constant material is used for the gate insulating layer 123, gate leakage current can be reduced.

Figure 6C:
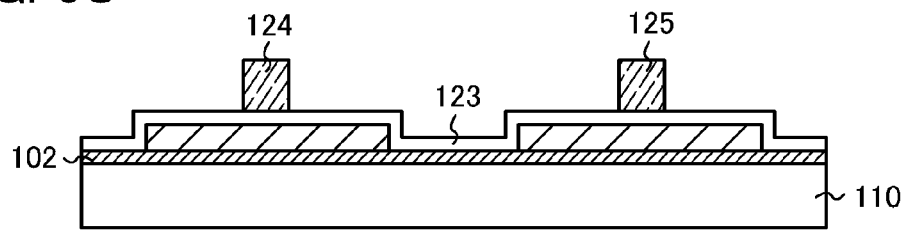
Figure 6D:
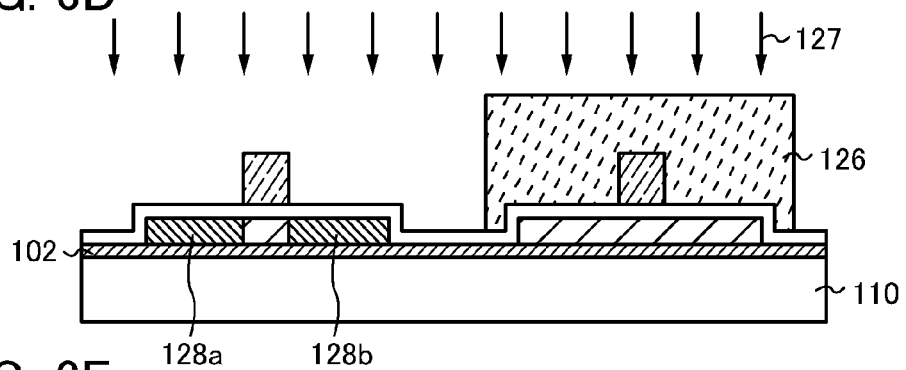
Figure 6E:
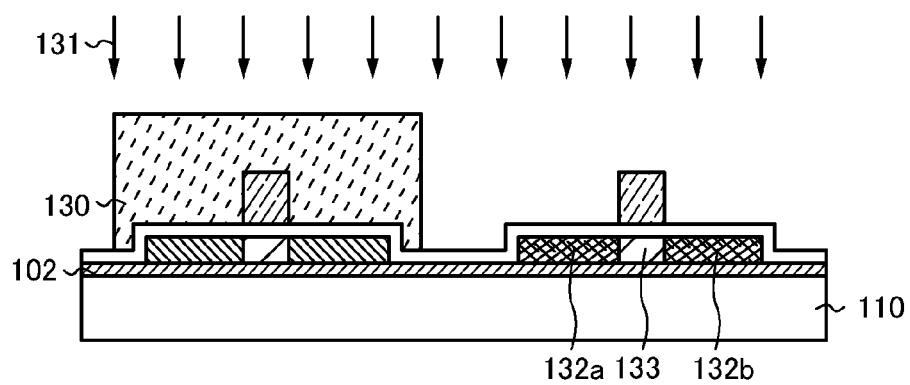

A gate electrode layer 124 and a gate electrode layer 125 are formed over the gate insulating layer 123 (see FIG. 6C). The gate electrode layers 124 and 125 can be formed by a sputtering method, an evaporation method, a CVD method, or the like. The gate electrode layers 124 and 125 may be formed using an element selected from tantalum (Ta), tungsten (W), titanium (Ti), molybdenum (Mo), aluminum (Al), copper (Cu), chromium (Cr), and neodymium (Nd), or an alloy material or compound material containing the above-described element as a main component. Alternatively, as the gate electrode layers 124 and 125, a semiconductor layer typified by a polycrystalline silicon layer doped with an impurity element such as phosphorus, or an AgPdCu alloy may be used.

In the SOI substrate according to the present invention, the surface of the single crystal semiconductor layer is planarized; thus, a gate insulating layer with high withstand voltage can be formed.

A mask 126 which covers the single crystal semiconductor layer 122 is formed. With the use of the mask 126 and the gate electrode layer 124 as masks, an impurity element 127 imparting n-type conductivity is added to form first n-type impurity regions 128a and 128b (see FIG. 6D). In this embodiment, phosphine ($PH_3$) is used as a doping gas containing an impurity element. Here, the impurity element imparting n-type conductivity is added so that the first n-type impurity regions 128a and 128b contain the impurity element imparting n-type conductivity at a concentration of about $1\times10^{17}$ to $5\times10^{18}/cm^3$. In this embodiment, phosphorus (P) is used as the impurity element imparting n-type conductivity.

Next, after the mask 126 is removed, a mask 130 which covers the single crystal semiconductor layer 121 is formed. With the use of the mask 126 and the gate electrode layer 125 as masks, an impurity element 131 imparting p-type conductivity is added to form first p-type impurity regions 132a and 132b (see FIG. 6E). In this embodiment, boron (B) is used as an impurity element; thus, diborane ($B_2H_6$) or the like is used as a doping gas containing an impurity element.

Figure 7A:
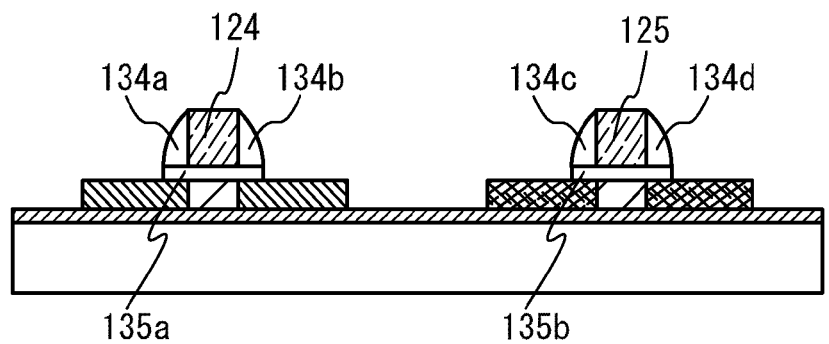
FIGS. 7A to 7C are diagrams illustrating an example of a semiconductor device using an SOI substrate according to the present invention.
Figure 7B:
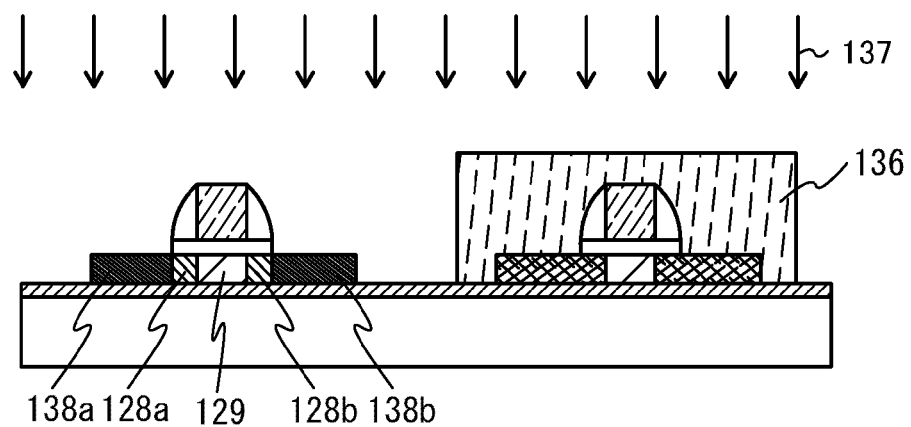

After the mask 130 is removed, sidewall insulating layers 134a to 134d with a sidewall structure are formed on side surfaces of the gate electrode layers 124 and 125, and gate insulating layers 135a and 135b are formed (see FIG. 7A). The sidewall insulating layers 134a to 134d with a sidewall structure may be formed on the side surfaces of the gate electrode layers 124 and 125 in a self-alignment manner as follows: an insulating layer covering the gate electrode layers 124 and 125 is formed and is then processed by anisotropic etching by a reactive ion etching (RIE) method. Here, there is no particular limitation on the insulating layer and the insulating layer is preferably a layer of silicon oxide with favorable step coverage, which is formed by reaction of tetraethyl orthosilicate (TEOS), silane, or the like with oxygen, nitrous oxide, or the like. The insulating layer can be formed by a thermal CVD method, a plasma CVD method, an atmospheric pressure CVD method, a bias ECRCVD method, a sputtering method, or the like. The gate insulating layers 135a and 135b can be formed by etching the gate insulating layer 123 with the gate electrode layers 124 and 125 and the sidewall insulating layers 134a to 134d used as masks.

In this embodiment, in etching the insulating layer, the insulating layer over the gate electrode layers is removed to expose the gate electrode layers. However, the sidewall insulating layers 134a to 134d may be formed to have such a shape that the insulating layer remains over the gate electrode layers. In addition, a protective film may be formed over the gate electrode layers in a later step. By protecting the gate electrode layers in this manner, film reduction of the gate electrode layers can be prevented when etching is conducted. Further, in the case of forming silicide in a source region and a drain region, because a metal film formed in the formation of the silicide is not in contact with the gate electrode layers, even when the metal film is formed using a material which is likely to react with a material of the gate electrode layer, defects in chemical reaction, diffusion, or the like can be prevented. The etching method may be a dry etching method or a wet etching method, and a variety of etching methods can be used. In this embodiment, a dry etching method is used. As an etching gas, a chlorine based gas typified by $Cl_2$, $BCl_3$, $SiCl_4$, $CCl_4$, or the like, a fluorine based gas typified by $CF_4$, $SF_6$, $NF_3$, or the like, or $O_2$ can be appropriately used.

Next, a mask 136 which covers the single crystal semiconductor layer 122 is formed. With the use of the mask 136, the gate electrode layer 124, and the sidewall insulating layers 134a and 134b as masks, an impurity element 137 imparting n-type conductivity is added to form second n-type impurity regions 138a and 138b. In this embodiment, $PH_3$ is used as a doping gas containing an impurity element. Here, the impurity element imparting n-type conductivity is added so that the second n-type impurity regions 138a and 138b contain the impurity element imparting n-type conductivity at a concentration of about $5\times10^{19}$ to $5\times10^{20}/cm^3$. Moreover, a channel formation region 129 is formed in the single crystal semiconductor layer 121 (see FIG. 7B).

The second n-type impurity regions 138a and 138b are high-concentration n-type impurity regions and serve as a source and a drain. On the other hand, the first n-type impurity regions 128a and 128b are low-concentration impurity regions and serve as lightly doped drain (LDD) regions. Because the first n-type impurity regions 128a and 128b are formed in Loff regions, which are not covered with the gate electrode layer 124, an effect of reducing off current can be obtained. As a result, a semiconductor device with higher reliability and lower power consumption can be manufactured.

The mask 136 is removed, and heat treatment, irradiation with strong light, or irradiation with a laser beam may be performed in order to activate the impurity element. At the same time as the activation, plasma damage to the gate insulating layer and plasma damage to an interface between the gate insulating layer and the single crystal semiconductor layer can be repaired.

Subsequently, an interlayer insulating layer which covers the gate electrode layer and the gate insulating layer is formed. In this embodiment, a multilayer structure of an insulating film 139 containing hydrogen to serve as a protective film and an insulating layer 140 is employed. The insulating film 139 and the insulating film 140 may be a silicon nitride film, a silicon nitride oxide film, a silicon oxynitride film, or a silicon oxide film formed by a sputtering method or a plasma CVD method. Alternatively, a single layer structure or a multilayer structure of three or more layers using a different insulating film containing silicon may be employed.

Furthermore, a step in which heat treatment is performed at 300° C. to 550° C. for 1 hour to 12 hours in a nitrogen atmosphere to hydrogenate the single crystal semiconductor layer is performed. Preferably, the step is performed at 400° C. to 500° C. This step is a step for terminating dangling bonds of the single crystal semiconductor layer by hydrogen contained in the insulating film 140 which is an interlayer insulating layer. In this embodiment, the heat treatment is performed at 410° C. for one hour.

The insulating film 139 and the insulating film 140 can alternatively be formed of a material selected from aluminum nitride (AlN), aluminum oxynitride (AlON), aluminum nitride oxide which contains more nitrogen than oxygen (AlNO), aluminum oxide, diamond-like carbon (DLC), nitrogen-containing carbon (CN), or other substances containing an inorganic insulating material. In addition, a siloxane resin may also be used. The siloxane resin corresponds to a resin including an Si—O—Si bond. Siloxane has a skeletal structure formed of a bond of silicon (Si) and oxygen (O). As a substituent, an organic group (for example, an alkyl group or an aryl group) containing at least hydrogen is used. Alternatively, a fluoro group may be used as a substituent. Further, an organic group containing at least hydrogen and a fluoro group may also be used as a substituent. Further, an organic insulating material such as polyimide, acrylic, polyamide, polyimide amide, resist, benzocyclobutene, or polysilazane can also be used. A coating film with favorable planarity formed by a coating method may also be used.

The insulating film 139 and the insulating film 140 can be formed with the use of dipping, spray coating, a doctor knife, a roll coater, a curtain coater, a knife coater, a CVD method, an evaporation method, or the like. The insulating film 139 and the insulating film 140 may be formed by a droplet discharge method. In the case of employing the droplet discharge method, a material solution can be saved. Alternatively, a method capable of transferring or drawing a pattern similarly to a droplet discharge method, for example, a printing method (a method of forming a pattern, such as screen printing, offset printing, or the like) can be used.

Next, contact holes (openings) reaching the single crystal semiconductor layer are formed in the insulating film 139 and the insulating film 140 using a mask formed of a resist. Etching may be conducted only once or a plurality of times depending on the etching selectivity between the materials which are used. The insulating film 139 and the insulating film 140 are partly removed by the etching to form the openings reaching the second n-type impurity regions 138a and 138b and the second p-type impurity regions 132a and 132b, which are source regions and drain regions. For the etching, wet etching, dry etching, or the both may be employed. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used. Further, an inert gas may be added to an etching gas. As an inert element to be added, one or a plurality of elements selected from He, Ne, Ar, Kr, and Xe can be used.

A conductive film is formed so as to cover the openings, and the conductive film is etched to form wiring layers 141a, 141b, 142a, and 142b which serve as source and drain electrode layers which are electrically connected to parts of source regions and drain regions. The wiring layers can be formed by forming a conductive film by a PVD method, a CVD method, an evaporation method, or the like, and then etching the conductive film into desired shapes. Alternatively, the wiring layers can be formed by forming conductive layers selectively in predetermined positions by a droplet discharge method, a printing method, an electrolytic plating method, or the like. Further, a reflow method or a damascene method may be used. As a material for the wiring layers, metal such as Ag, Au, Cu, Ni, Pt, Pd, Ir, Rh, W, Al, Ta, Mo, Cd, Zn, Fe, Ti, Zr, or Ba; or Si or Ge; or an alloy or nitride thereof is used. Further, a multilayer structure thereof may be used.

Figure 7C:
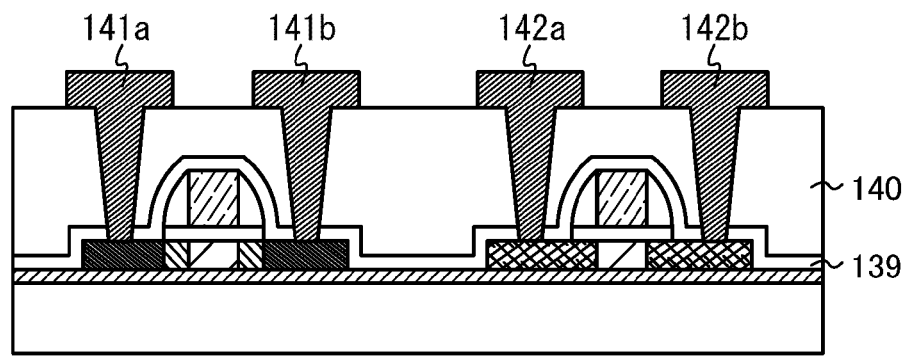

Through the above steps, a semiconductor device having a CMOS structure which includes an n-channel thin film transistor and a p-channel thin film transistor can be manufactured (see FIG. 7C). Although not shown in the drawings, because a CMOS structure is formed in this embodiment, the n-channel thin film transistor and the p-channel thin film transistor are electrically connected to each other.

The structure of the thin film transistor is not limited to this embodiment, and a single gate structure in which one channel formation region is formed, a double gate structure in which two channel formation regions are formed, or a triple gate structure in which three channel formation regions are formed may be employed.

In the semiconductor device using the SOI substrate according to the present invention, the surface of the single crystal semiconductor layer is planarized. Thus, the localized level density at an interface between the single crystal semiconductor layer and the gate insulating layer can be reduced. Further, crystal defects in the single crystal semiconductor layer can be reduced; thus, electrical characteristics of semiconductor elements can be improved. As described above, a high-performance and highly-reliable semiconductor device can be manufactured with high yield with the use of a semiconductor substrate which has a single crystal semiconductor layer with reduced crystal defects and high planarity.

In this manner, a thin film transistor can be manufactured with the use of a semiconductor substrate. The single crystal semiconductor layer of the SOI substrate to which the present invention is applied has reduced crystal defects, a reduced interface state density with the gate insulating layers 135a and 135b, and a planarized surface. Accordingly, thin film transistors with excellent characteristics such as low driving voltage, high electron field effect mobility, and a low subthreshold value can be formed using the SOI substrate. Furthermore, high-performance transistors with little characteristic variation between the transistors can be formed over one substrate. In other words, with the use of the SOI substrate according to the present invention, nonuniformity of the important characteristic value as transistor characteristics, such as threshold voltage or mobility, can be suppressed and high performance such as high field effect mobility can be obtained.

Thus, a semiconductor device with high added value can be manufactured by forming various semiconductor elements such as TFTs using the semiconductor substrate according to the present invention.

(Embodiment 4)

Although a method for manufacturing TFTs is described in Embodiment 3, a semiconductor device with high added value can be manufactured by forming a variety of semiconductor elements such as a capacitor and a resistor together with the TFTs. Specific modes of semiconductor devices are described below with reference to drawings.

Figure 8:
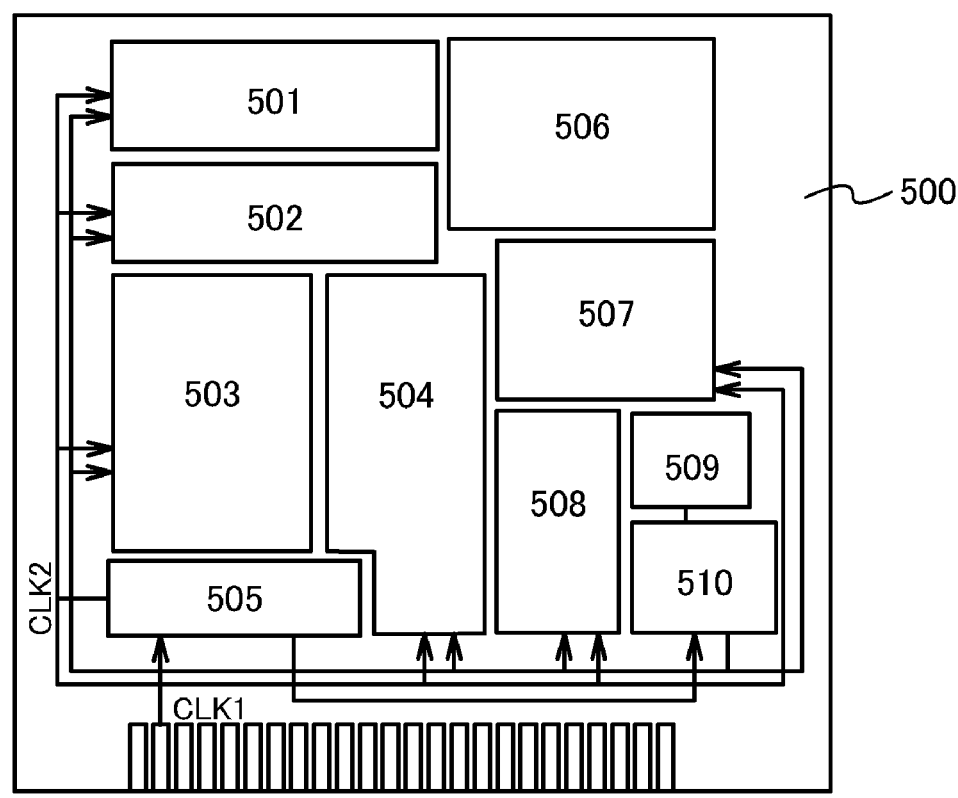
FIG. 8 is a block diagram illustrating a structure of a microprocessor obtained using an SOI substrate according to the present invention.

First, a microprocessor is described as an example of semiconductor devices. FIG. 8 is a block diagram showing an example of a structure of a microprocessor 500.

The microprocessor 500 has an arithmetic logic unit (also referred to as an "ALU") 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 8, the internal clock signal CLK2 is input to other circuits.

Figure 9:
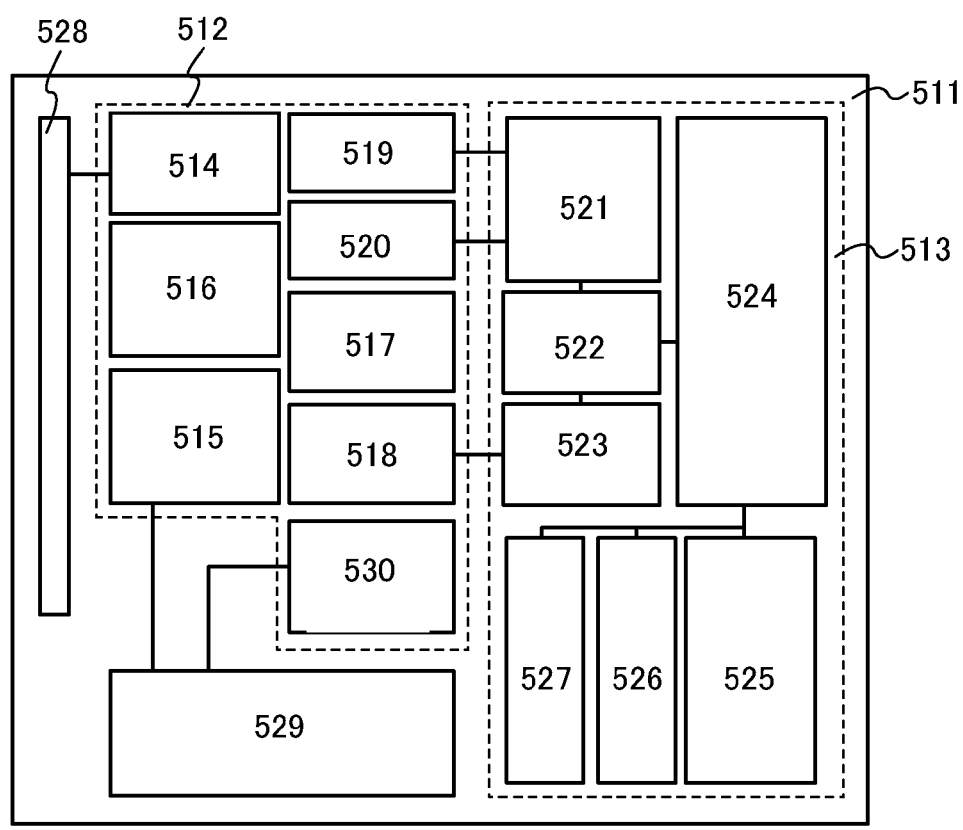
FIG. 9 is a block diagram of a structure of an RFCPU obtained using an SOI substrate according to the present invention.

Next, an example of a semiconductor device having an arithmetic function and a contactless data transmission and reception function is described. FIG. 9 is a block diagram showing an example of a structure of such a semiconductor device. A semiconductor device shown in FIG. 9 can be called a computer that operates to transmit and receive signals to and from an external device by wireless communication (such a computer is hereinafter referred to as an "RFCPU").

As shown in FIG. 9, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, a CPU interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after a rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on variation of its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address which the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

In such an RFCPU, an integrated circuit is formed using the single crystal semiconductor layer 112 with reduced crystal defects and a uniform crystal orientation; therefore, processing speed can be increased and power consumption can be reduced. Accordingly, even when the capacitor portion 529, which supplies electric power, is miniaturized, long-term operation is ensured.

(Embodiment 5)

In this embodiment, display devices using a semiconductor substrate according to the present invention will now be described with reference to FIGS. 10A and 10B and FIGS. 11A and 11B.

Figure 10A:
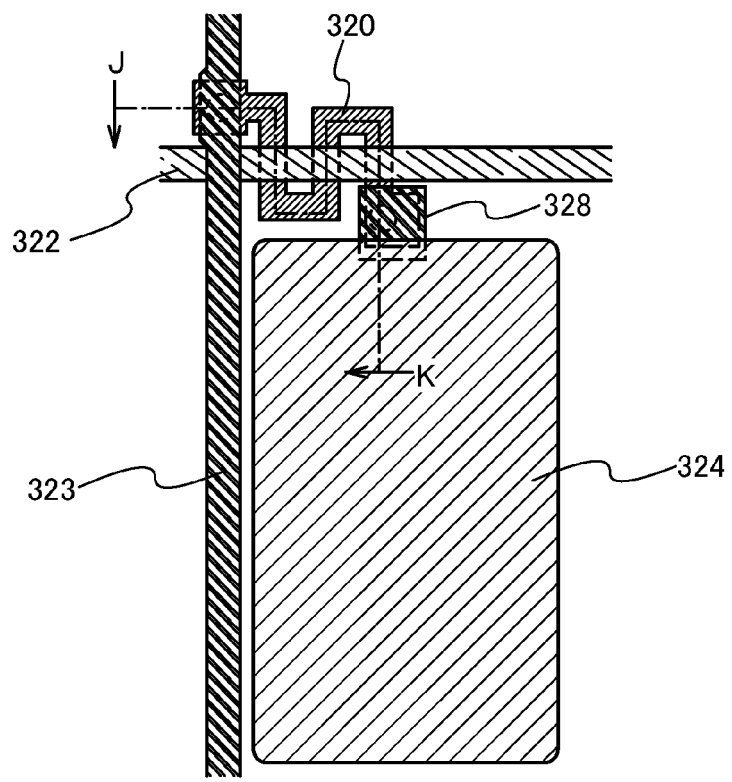
FIG. 10A is a plan view of a pixel of a liquid crystal display device and FIG. 10B is a cross-sectional view taken along the line J-K in FIG. 10A.
Figure 10B:
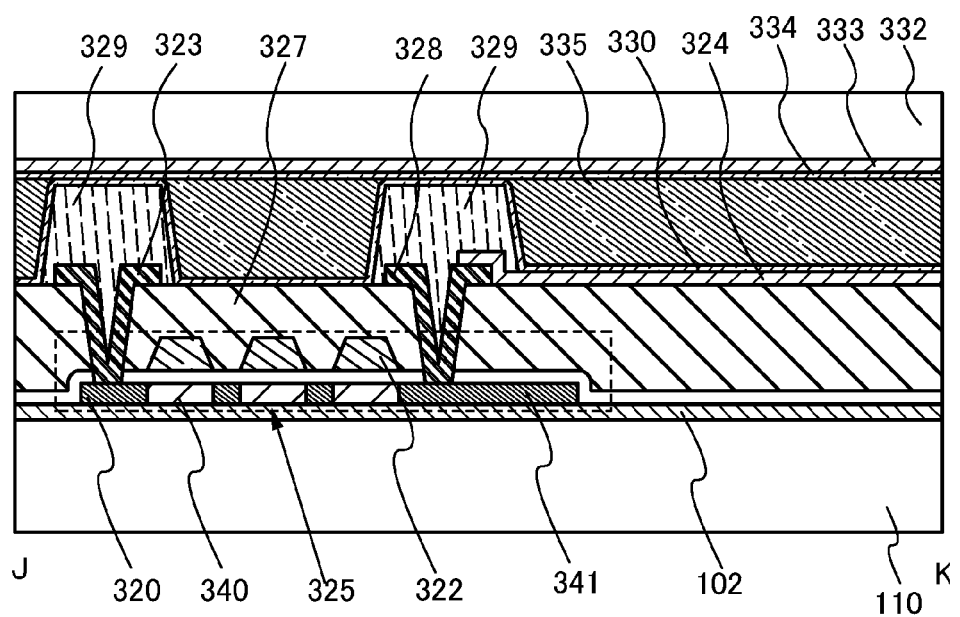

FIGS. 10A and 10B are drawings for describing a liquid crystal display device. FIG. 10A is a plan view of a pixel of the liquid crystal display device, and FIG. 10B is a cross-sectional view of FIG. 10A taken along a section line J-K.

As shown in FIG. 10A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer which is formed of the single crystal semiconductor layer included in the SOI substrate according to the present invention. As described in Embodiment 1, irradiation with a laser beam is performed after etching treatment is performed, and then plasma treatment is performed, so that crystal defects in the single crystal semiconductor layer 112 can be reduced and the planarity of the surface of the single crystal semiconductor layer 112 can be improved. The single crystal semiconductor layer 320 is included in a TFT 325 of the pixel.

As a semiconductor substrate, the SOI substrate described in either one of Embodiments 1 and 2 is used. As shown in FIG. 10B, the single crystal semiconductor layer 320 is stacked over the base substrate 110 with the insulating film 102 interposed therebetween. As the base substrate 110, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 which covers the counter electrode 333 are formed. The columnar spacers 329 are formed to maintain a space between the base substrate 110 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

In an SOI substrate which is formed by a method for manufacturing a semiconductor substrate according to the present invention, crystal defects are reduced and the planarity of the surface is improved; therefore, high-performance transistors with little characteristic variation between the transistors can be formed over one substrate. Accordingly, by manufacturing a liquid crystal display device using the SOI substrate according to the present invention, characteristic variation between transistors can be small.

Figure 11A:
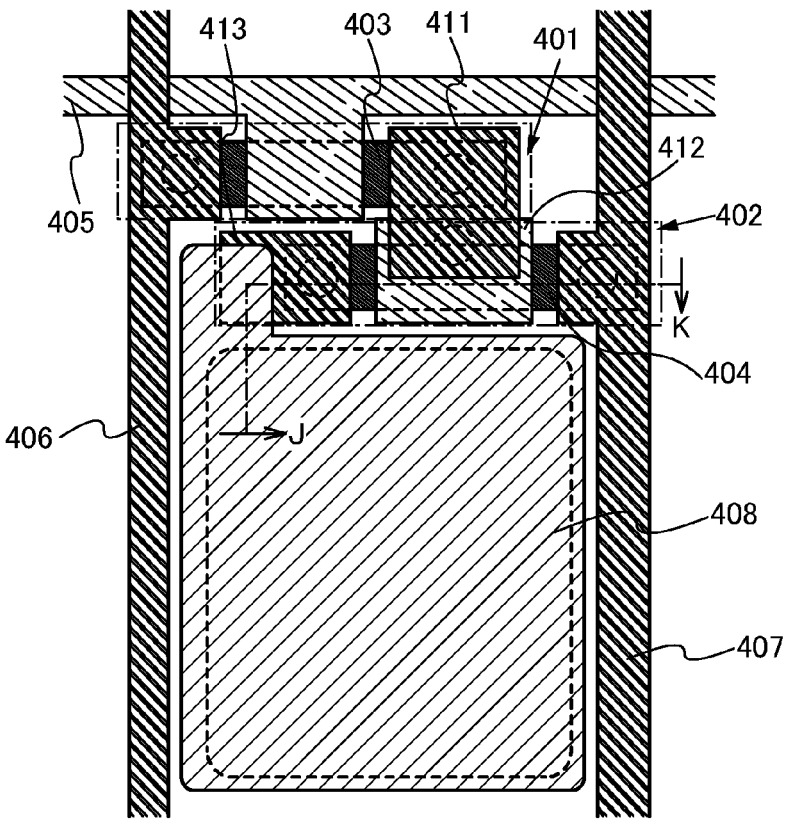
FIG. 11A is a plan view of a pixel of an electroluminescent display device and FIG. 11B is a cross-sectional view taken along the line J-K in FIG. 11A.
Figure 11B:
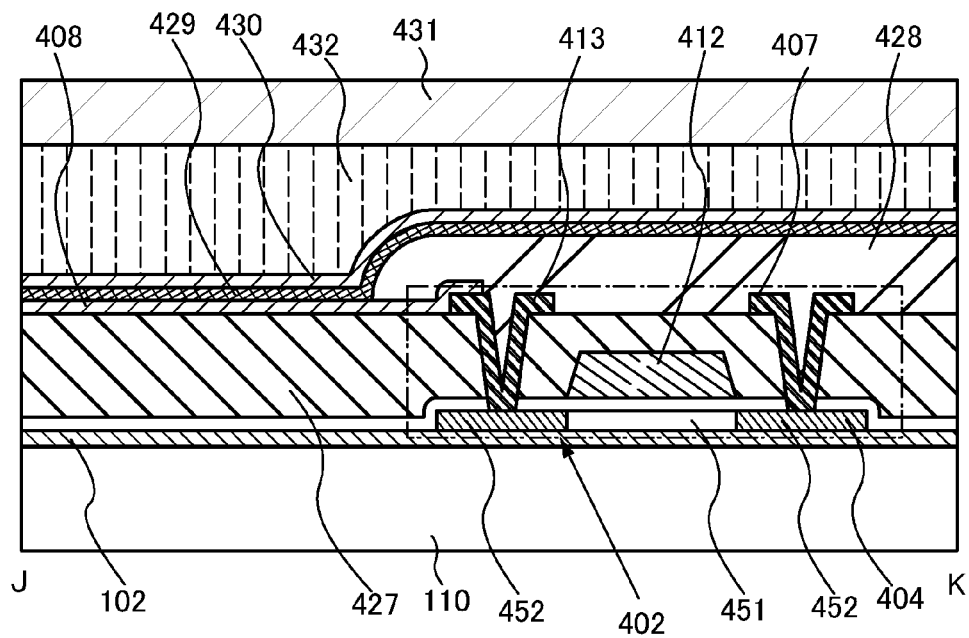

Next, an electroluminescent display device (hereinafter referred to as an "EL display device") is described with reference to FIGS. 11A and 11B. FIG. 11A is a plan view of a pixel of the EL display device, and FIG. 11B is a cross-sectional view of FIG. 11A taken along a section line J-K.

As illustrated in FIG. 11A, the pixel includes a selecting transistor 401 and a display control transistor 402 that are transistors, a scan line 405, a signal line 406, a current supply line 407, and a pixel electrode 408. Each pixel is provided with a light emitting element having a structure in which a layer containing an electroluminescent material (EL layer) is interposed between a pair of electrodes. One of the electrodes of the light emitting element is the pixel electrode 408. In a semiconductor film 403, a channel formation region, a source region, and a drain region of the selecting transistor 401 are formed. In a semiconductor film 404, a channel formation region, a source region, and a drain region of the display control transistor 402 are formed. The semiconductor films 403 and 404 are formed of the single crystal semiconductor layer 302 that is provided over the base substrate.

In the selecting transistor 401, a gate electrode is included in the scan line 405; one of a source electrode and a drain electrode is included in the signal line 406; and the other is formed as an electrode 410. In the display control transistor 402, a gate electrode 412 is electrically connected to the electrode 411; one of a source electrode and a drain electrode is formed as an electrode 413 which is electrically connected to the pixel electrode 408; and the other is included in the current supply line 407.

The display control transistor 402 is a p-channel TFT. As shown in FIG. 11B, a channel formation region 451 and p-type high-concentration impurity regions 452 are formed in the semiconductor film 404. Note that, as the semiconductor substrate, the semiconductor substrate manufactured in either one of Embodiments 1 and 2 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the base substrate 110 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. However, in an SOI substrate which is formed by a method for manufacturing an SOI substrate according to the present invention, crystal defects are reduced and the planarity of the surface is improved; therefore, high-performance transistors with little characteristic variation between the transistors can be formed over one substrate. Accordingly, by manufacturing an EL display device using the SOI substrate according to the present invention, characteristic variation of the selecting transistor 401 and the display control transistor 402 between pixels is eliminated; therefore, the current driving method can be employed.

(Embodiment 6)

The SOI substrate according to the present invention is used for manufacturing a semiconductor device such as a transistor, and a variety of electronic devices can be manufactured using the semiconductor device. Because a single crystal semiconductor layer provided in the SOI substrate according to the present invention has reduced crystal defects and has a surface with improved planarity, by using such a single crystal semiconductor layer as an active layer, a semiconductor element with improved electrical characteristics can be manufactured. In addition, because the single crystal semiconductor layer has reduced crystal defects, the localized level density at an interface with a gate insulating layer can be reduced. Further, because the single crystal semiconductor layer has high planarity, a thin gate insulating layer having a high withstand voltage can be formed over the single crystal semiconductor layer; therefore, improvement in mobility, improvement in an S value, and suppression of a short channel effect of the manufactured semiconductor element can be achieved. In other words, by using the SOI substrate according to the present invention, a highly-reliable semiconductor element with high current drive capability can be manufactured. As a result, electronic devices which are end products can be manufactured with high throughput and high quality. Various kinds of semiconductor devices can be manufactured using the semiconductor element. In this embodiment, specific examples are described with reference to drawings. Note that in this embodiment, the same reference numerals denote the same parts as in above embodiments, and a detailed description is omitted.

Figure 12A:
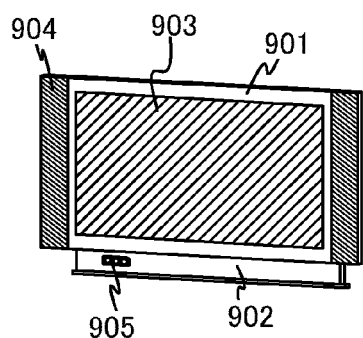
FIGS. 12A to 12F each show an electronic device in which an SOI substrate according to the present invention is used.

FIG. 12A shows a display device which includes a chassis 901, a supporting base 902, a display portion 903, a speaker portion 904, a video input terminal 905, and the like. This display device is manufactured using the transistors formed by the manufacturing method described in another embodiment for a driver IC, the display portion 903, and the like. Note that the display device refers to a liquid crystal display device, a light-emitting display device, and the like, and all the information display devices for, for example, computers, television reception, and advertisement display can be included. Specifically, a display, a head-mounted display, a reflection type projector, and the like can be given.

Figure 12B:
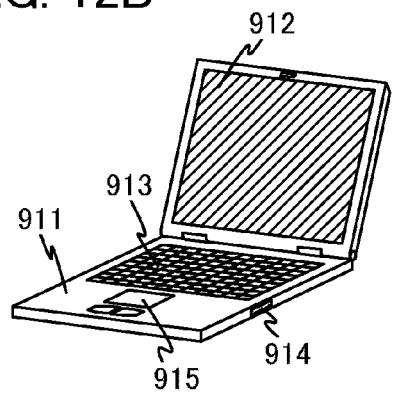

FIG. 12B shows a computer which includes a chassis 911, a display portion 912, a keyboard 913, an external connection port 914, a pointing device 915, and the like. A transistor formed according to the present invention can be applied not only to a pixel portion in the display portion 912 but also to a semiconductor device such as a driver IC for display, a CPU inside a main body, or a memory.

Figure 12C:
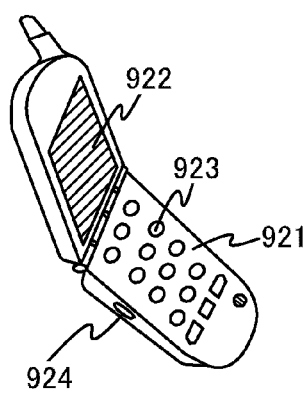

FIG. 12C shows a cellular phone, which is a typical example of a portable information processing terminals. This cellular phone includes a chassis 921, a display portion 922, an operation key 923, and the like. A transistor formed using the SOI substrate according to the present invention can be applied not only to a pixel portion in the display portion 922 or a sensor portion 924, but also to a driver IC for display, a memory, an audio processing circuit, and the like. The sensor portion 924 includes an optical sensor element, by which the luminance of the display portion 922 is controlled based on the luminance obtained by the sensor portion 924, and the brightness of the operation keys 923 is controlled based on the luminance obtained by the sensor portion 924. Thus, the power consumption of the cellular phone can be suppressed.

A semiconductor material formed according to the present invention can be used for electronic devices such as a PDA (a personal digital assistant or a portable information processing terminals), a digital camera, a compact game machine, or a portable audio playback device, in addition to the above cellular phone. For example, the semiconductor material of the present invention can be used for forming a functional circuit such as a CPU, a memory, or applied to a sensor or to a pixel portion or a driver IC for display of those electronic appliances.

Figure 12D:
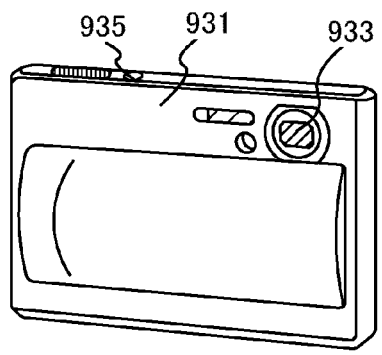
Figure 12E:
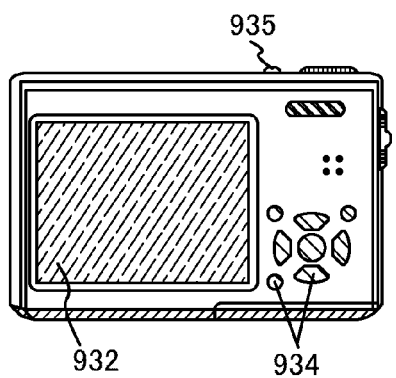

FIGS. 12D and 12E show a digital camera. Note that FIG. 12E shows a rear side of the digital camera shown in FIG. 12D. This digital camera includes a chassis 931, a display portion 932, a lens 933, an operation key 934, a shutter button 935, and the like. A transistor formed according to the present invention can be applied to a pixel portion in the display portion 932, a driver IC for driving the display portion 932, a memory, and the like.

Figure 12F:
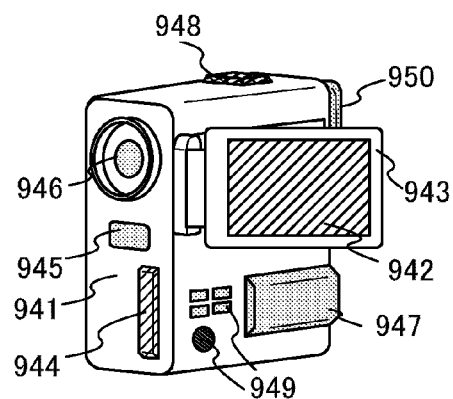

FIG. 12F shows a digital video camera. This digital video camera includes a main body 941, a display portion 942, a chassis 943, an external connection port 944, a remote control receiving portion 945, an image receiving portion 946, a battery 947, an audio input portion 948, an operation key 949, an eye piece portion 950, and the like. A transistor formed according to the present invention can be applied to a pixel portion in the display portion 942, a driver IC for driving the display portion 942, a memory, a digital input processing device, and the like.

Besides, the present invention can be applied to a navigation system, an audio playback device, an image reproducing device provided with a recording medium, and the like. A transistor manufactured according to the present invention can be applied to a pixel portion in a display portion, a driver IC for controlling the display portion, a memory, a digital input processing device, a sensor portion, and the like of those devices.

Figure 13A:
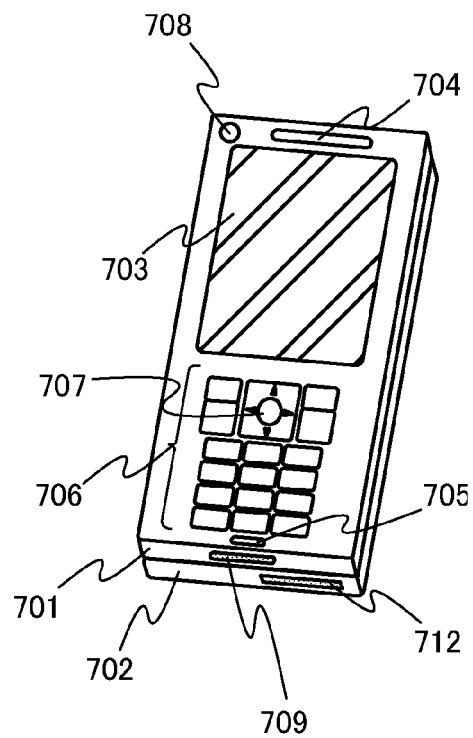
FIGS. 13A to 13C show a cellular phone in which an SOI substrate according to the present invention is used.
Figure 13B:
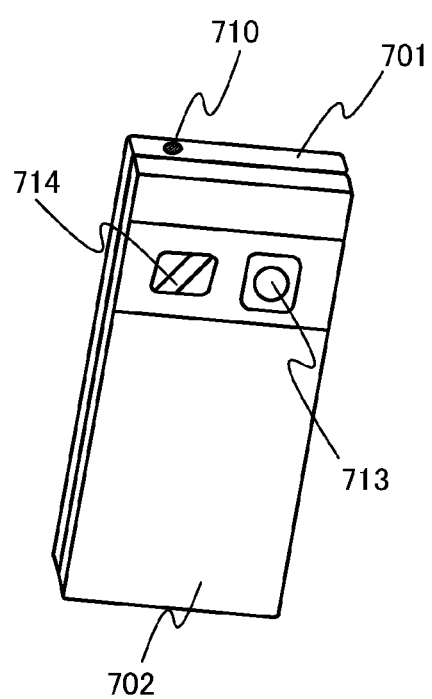
Figure 13C:
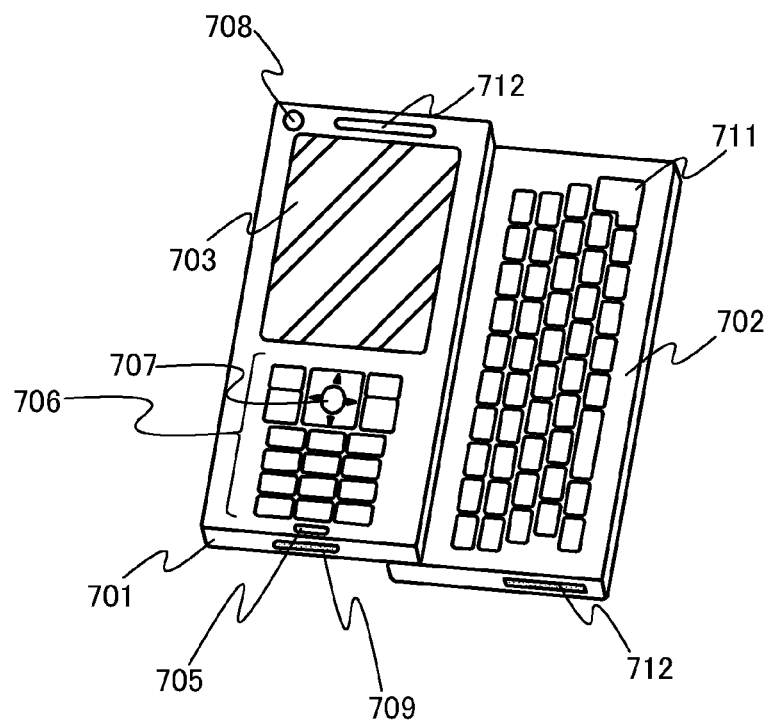

FIGS. 13A to 13C show another example of a cellular phone to which the present invention is applied. FIG. 13A is a front view, and FIG. 13B is a rear view, and FIG. 13C is a front view in which two chassis are slid. The cellular phone 700 is a so-called smartphone that has both functions of a cellular phone and a portable information terminal and incorporates a computer and can process a variety of data processing in addition to voice calls.

The cellular phone 700 has a chassis 701 and a chassis 702. The chassis 701 includes a display portion 703, a speaker 704, a microphone 705, an operation key 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element formed using the SOI substrate according to the present invention can be applied to a pixel portion in the display portion 703, a driver IC for driving the display portion 703, a memory, an audio processing circuit, and the like. Further, by applying the liquid crystal display device shown in FIGS. 10A and 10B or the EL display device shown in FIGS. 11A and 11B to the display portion 703, the display portion can have little display unevenness and excellent image quality.

Further, in addition to the above structure, the cellular phone 700 may incorporate a non-contact IC chip, a small memory device, or the like.

The chassis 701 and 702 which overlap with each other (see FIG. 13A) can be slid, and are slid to be developed as shown in FIG. 13C. Because the display portion 703 and the camera lens 708 are provided in the same plane, the smartphone can be used as a videophone. Further, a still image and a moving image can be taken with the rear camera 713 and the light 714 using the display portion 703 as a viewfinder.

With the use of the speaker 704 and the microphone 705, the cellular phone 700 can be used as an audio recording device (a recording device) or an audio playback device. Further, with the use of the operation keys 706, making and receiving calls, inputting simple information such as e-mails or the like, scrolling the screen displayed on the display portion, moving the cursor, e.g., for selecting information to be displayed on the display portion, and the like are possible.

If much information is needed to be treated, such as a case in which the smartphone is used for documentation or used as a portable information terminal, the use of the keyboard 711 is convenient. Further, the chassis 701 and the chassis 702 which overlap with each other (see FIG. 13A) can be slid to be developed as shown in FIG. 13C. In the case of using the smartphone as a portable information terminal, smooth operation can be conducted with the keyboard 711 and the pointing device 707. To the external connection terminal 709, an AC adaptor and various types of cables such as a USB cable can be connected, and charging and data communication with a personal computer or the like are possible. Further, a large amount of data can be stored and moved by inserting a recording medium into the external memory slot 712.

In the rear surface of the chassis 702 (see FIG. 13B), the rear camera 713 and the light 714 are provided, and a still image and a moving image can be taken using the display portion 703 as a viewfinder.

Further, the smartphone may have an infrared communication function, a USB port, a function of receiving one segment television broadcast, a non-contact IC chip, an earphone jack, or the like, in addition to the above-described functions and structures.

As described above, the range of application of the semiconductor device manufactured according to the present invention is very wide. The semiconductor device which is manufactured using the semiconductor substrate according to the present invention can be used for electronic devices in a variety of fields.

EXAMPLE 1

In this example, changes in surface characteristics when a surface of a single crystal semiconductor layer is subjected to plasma treatment will be described.

Samples used in this example are described. First, an oxide film was formed by oxidizing a surface of a single crystal silicon substrate with a gas including hydrochloric acid. The single crystal silicon substrate was irradiated with hydrogen ions through the oxide film in order to form an embrittled region in the single crystal silicon substrate. Next, a surface of the single crystal silicon substrate through which the hydrogen ions are added to form the embrittled region was bonded to a surface of a glass substrate and heat treatment was performed so that separation was caused along the embrittled region. Through the above steps, a single crystal silicon layer was formed over the glass substrate with the oxide film interposed therebetween. In such a manner, a plurality of samples (Samples A to F) in each of which the single crystal silicon layer is formed over the glass substrate with the oxide film interposed therebetween was prepared.

Then, each of Samples A to F was subjected to dry etching in order to remove a superficial layer portion of the single crystal silicon layer. The dry etching was performed by an ICP etching method under conditions with an ICP power of 1000 W, a power supplied to a lower electrode of 50 W, a reaction pressure of 1.5 Pa, and a chlorine gas of 100 sccm.

Next, each of Sample A and Sample B was subjected to dry etching using a nitrogen trifluoride gas in order to remove a native oxide film formed on the single crystal silicon layer. The dry etching was performed by an ICP etching method under conditions with an ICP power of 500 W (0.71 W/cm$^2$), an RF bias voltage of 0 W, a reaction pressure of 1.0 Pa, and a nitrogen trifluoride gas of 50 sccm. Treatment time was set to 10 seconds. Then, the single crystal silicon layer in each of Sample A and Sample B was irradiated with a laser beam.

Moreover, the single crystal silicon layer of Sample B was subjected to plasma treatment after irradiation with the laser beam. Plasma treatment was performed using an apparatus manufactured by Tokyo Electron Limited (ME-500, an ICP plasma dry etching apparatus) by an ICP method under conditions with an ICP power of 500 W (0.11 W/cm$^2$), an RF bias voltage of 100 W (0.61 W/cm$^2$), a pressure of 1.35 Pa, and an argon gas flow rate of 100 sccm. Treatment time was set to 240 seconds.

Next, each of Sample C and Sample D was subjected to dry etching in order to remove a native oxide film formed on the single crystal silicon layer. The dry etching was performed by an ICP etching method under conditions with an ICP power of 500 W (0.11 W/cm$^2$), an RF bias voltage of 100 W (0.61 W/cm$^2$), a reaction pressure of 1.35 Pa, and an argon gas of 100 sccm. Treatment time was set to 240 seconds. Then, the single crystal silicon layer in each of Sample C and Sample D was irradiated with a laser beam.

Further, the single crystal silicon layer of Sample D was subjected to plasma treatment after irradiation with the laser beam. The plasma treatment was performed under conditions similar to those for Sample B.

Then, wet etching was performed using a 100-fold diluted hydrofluoric acid in order to remove a native oxide film formed on the single crystal silicon layer. Then, the single crystal silicon layer in each of Sample F and Sample D was irradiated with a laser beam.

Moreover, the single crystal silicon layer of Sample F was subjected to plasma treatment after irradiation with the laser beam. The plasma treatment was performed under conditions similar to those for Sample B.

Next, the surface roughness of the single crystal silicon layers of Samples A to F was measured. In this example, for measurement of the surface roughness of the silicon layers, an atomic force microscope (AFM) was used; thus, the average surface roughness (Ra) and the maximum peak-to-valley height (P-V) on the surface of the silicon layers were measured.

In this example, the average surface roughness (Ra) is obtained by expanding into three dimensions center line average surface roughness Ra which is defined by JIS B 0601: 2001 (ISO 4287:1997) so as to be able to apply Ra to a measurement surface. The Ra can be expressed as an average value of the absolute values of deviations from a reference surface to a specific surface and can be obtained by the following formula.

$$R_a = \frac{1}{S_0} \int_{Y_1}^{Y_2} \int_{X_1}^{X_2} |F(X, Y) - Z_0| dX dY$$

Note that the measurement surface is a surface which is shown by all the measurement data, and is represented by the following formula.

$$Z=F(X,Y)$$

The specific surface is a surface which is an object of roughness measurement, and is a rectangular region which is surrounded by four points represented by the coordinates ($X_1$, $Y_1$), ($X_1$, $Y_2$), ($X_2$, $Y_1$), and ($X_2$, $Y_2$). The area of the specific surface when the specific surface is flat ideally is denoted by $S_0$. Note that $S_0$ is obtained by the following formula.

$$S_0=(X_2-X_1)\cdot(Y_2-Y_1)$$

The root-mean-square surface roughness (RMS) is obtained by expanding into three dimensions the RMS of a cross section curve so as to be able to apply the RMS of a cross section curve to the measurement surface, in a similar manner to $R_a$. The RMS can be expressed as the square root of the average value of squares of deviations from the reference surface to the specific surface, and can be obtained by the following formula.

$$Z_0 = \frac{1}{S_0} \int_{Y_1}^{Y_2} \int_{X_1}^{X_2} F(X, Y) dX dY$$

The reference surface is a plane surface represented by $Z=Z_0$ when $Z_0$ is the average value of height of the specific surface. The reference surface is parallel to the XY plane. Note that $Z_0$ can be obtained by the following formula.

$$R_{ms} = \sqrt{\frac{1}{S_0} \int_{Y_1}^{Y_2} \int_{X_1}^{X_2} \{F(X, Y) - Z_0\}^2 dX dY}$$

The maximum peak-to-valley height (P-V) can be expressed as a difference between the height of the highest peak $Z_{max}$ and the height of the lowest valley $Z_{min}$ at the specific surface, and can be obtained by the following formula.

$$P-V=Z_{max}-Z_{min}$$

The peak and the valley used herein are obtained by expanding into three dimensions the "peak" and the "valley" that are defined by JIS B 0601:2001 (ISO 4287:1997). The peak can be expressed as the highest point at the specific surface and the valley can be expressed as the lowest point at the specific surface.

The measurement conditions of the average surface roughness (Ra) and the maximum peak-to-valley height (P-V) in this example are described below.

Atomic force microscope (AFM): a scanning probe microscope SPI3800N/SPA500 manufactured by Seiko Instruments Inc.
Measurement mode: dynamic force mode (DFM)
Cantilever: SI-DF40 (made of silicon, a spring constant of 42 N/m, a resonant frequency of 250 kHz to 390 kHz, and a probe tip R≦10 nm)
Scanning speed: 1.0 Hz
Measured area: 10 μm×10 μm
Measured points: 256 points×256 points Note that DFM refers to a measurement mode in which the surface shape of a sample is measured in a state where a cantilever is resonated at a given frequency (a frequency specific to the cantilever) while the distance between a probe and the sample is controlled so that the vibration amplitude of the cantilever is kept constant. In DFM, the cantilever does not touch the surface of the sample; thus, measurement is possible without changing the original shape of the surface of the sample and without damaging the surface.

The measurement of the surface roughness of the single crystal silicon layers was performed on Samples A to F under the above-described conditions. Images of three-dimensional surface shapes of the single crystal silicon layers were obtained. In consideration of the curvature of a cross section of a substrate of the obtained measurement images, all the data of the images were fitted for one-dimensional plane by a least-squares method with attached software to perform one-dimensional gradient correction for correcting the gradient in the plane, followed by quadratic gradient correction for correcting quadratic curve. After that, the surface roughness was analyzed with the attached software, so that each of the average surface roughness (Ra) and the maximum peak-to-valley height (P-V) were calculated.

Figure 14:
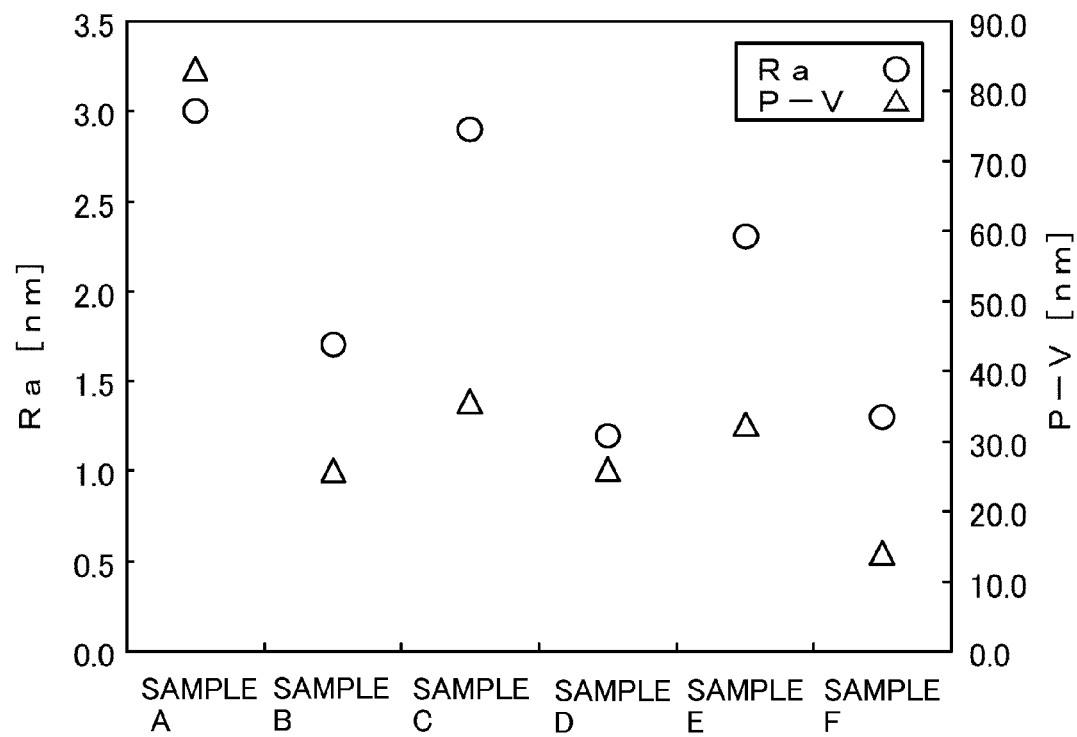
FIG. 14 is a graph showing measurement results of the surface roughness of single crystal silicon layers.

Table 1 and FIG. 14 show the average surface roughness (Ra) and the maximum peak-to-valley height (P-V), which were calculated.

|  | average surface roughness Ra (nm) | maximum peak-to-valley height P-V (nm) |
|---|---|---|
| Sample A | 3.0 | 83.2 |
| Sample B | 1.7 | 25.7 |
| Sample C | 2.9 | 35.8 |
| Sample D | 1.2 | 26.1 |
| Sample E | 2.3 | 32.4 |
| Sample F | 1.3 | 14.1 |

As shown in Table 1 and FIG. 14, the maximum peak-to-valley height (P-V) of Sample A irradiated with a laser beam after dry etching using an $NF_3$ gas was 83.2 nm In contrast, the maximum peak-to-valley height (P-V) of Sample B subjected to plasma treatment using an Ar gas after irradiation with a leaser beam was reduced down to 25.7 nm The other results were such that when Sample C was compared with Sample D, the average surface roughness and the maximum peak-to-valley height of Sample D subjected to plasma treatment were both lower than those of Sample C, and when Sample E was compared with Sample F, the average surface roughness and the maximum peak-to-valley height of Sample F subjected to plasma treatment were both lower than those of Sample E.

Figure 15A:
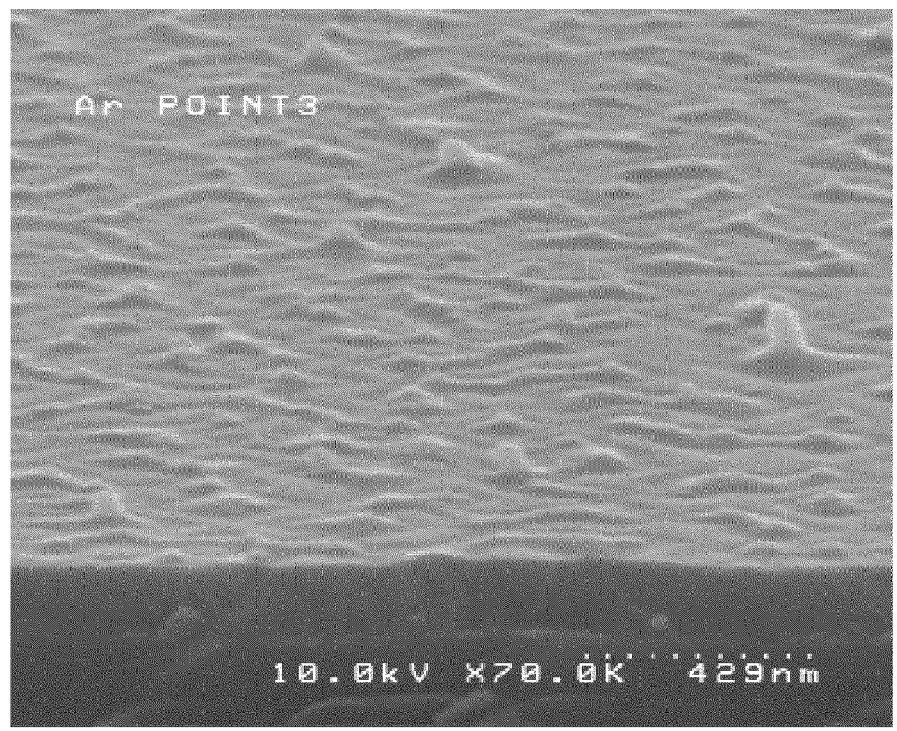
FIGS. 15A and 15B are each a SEM image of a surface.
Figure 15B:
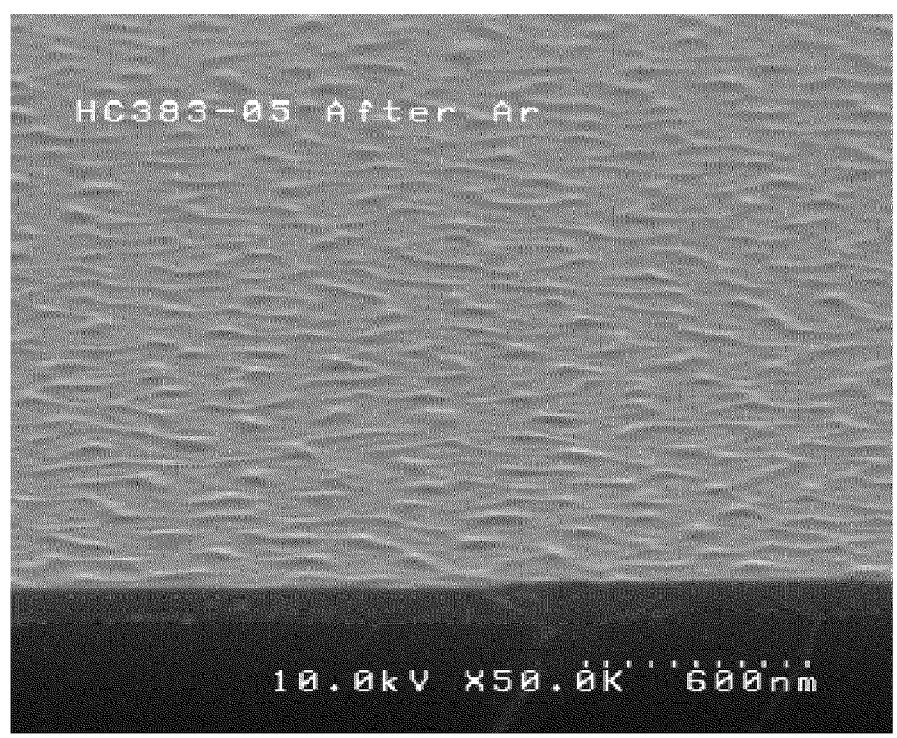

Then, FIGS. 15A and 15B are scanning electron microscope (SEM) images of Sample C and Sample D. FIG. 15A is a SEM image of Sample C after the single crystal semiconductor layer is irradiated with a laser beam. In FIG. 15A, it is found that projections are generated on the surface of the single crystal semiconductor layer. FIG. 15B is a photograph of Sample D after the single crystal semiconductor layer is irradiated with a laser beam and Ar plasma treatment is performed. It is found that projections are reduced on the surface of the single crystal semiconductor layer.

From the above results, it was confirmed that the average surface roughness and the maximum peak-to-valley height can be reduced after irradiation with a laser beam by performing plasma treatment.

EXAMPLE 2

In this example, changes in surface characteristics when plasma treatments is performed for various time periods after a single crystal semiconductor layer is irradiated with a laser beam will be described.

First, an oxide film was formed by oxidizing a surface of a single crystal silicon substrate with a gas including hydrochloric acid. The single crystal silicon substrate is irradiated with hydrogen ions through the oxide film in order to form an embrittled region in the single crystal silicon substrate. Then, a surface of the single crystal silicon substrate through which the hydrogen ions are added to form the embrittled region was bonded to a surface of a glass substrate and heat treatment was performed so that separation was caused along the embrittled region. Through the above steps, a single crystal silicon layer was formed over the glass substrate with the oxide film interposed therebetween. In such a manner, a plurality of samples in each of which the single crystal silicon layer is formed over the glass substrate with the oxide film interposed therebetween was prepared.

Then, the single crystal silicon layer of each of the plurality of samples was subjected to dry etching in order to remove a superficial layer portion of the single crystal silicon layer. The dry etching was performed by an ICP etching method under conditions with an ICP power of 150 W, an RF bias voltage of 40 W, a reaction pressure of 1.0 Pa, and a chlorine gas of 100 sccm.

Next, the plurality of samples was subjected to dry etching and was then irradiated with a laser beam. After irradiation with the laser beam, plasma treatment was performed. Plasma treatment was performed using an apparatus manufactured by Tokyo Electron Limited (ME-500, an ICP plasma dry etching apparatus) by an ICP method under conditions with an ICP power of 500 W (0.11 $W/cm^2$), an RF bias voltage of 100 W (0.61 $W/cm^2$), a pressure of 1.35 Pa, and an argon gas flow rate of 100 sccm. Treatment time was set to 2 minutes, 3 minutes, and 4 minutes. A sample which is not subjected to plasma treatment was Sample G, a sample which is subjected to plasma treatment for two minutes was Sample H, a sample which is subjected to plasma treatment for three minutes was Sample I, and a sample which is subjected to plasma treatment for four minutes was Sample J.

Next, the surface roughness of single crystal silicon layers of Samples G to J was measured. The measurement of the surface roughness was performed in a manner similar to that of the measurement in Example 1. Then, the average surface roughness (Ra) and the maximum peak-to-valley height (P-V) were calculated. The calculation method of the average surface roughness (Ra) and the maximum peak-to-valley height (P-V) in this example is similar to that in Example 1.

Figure 16:
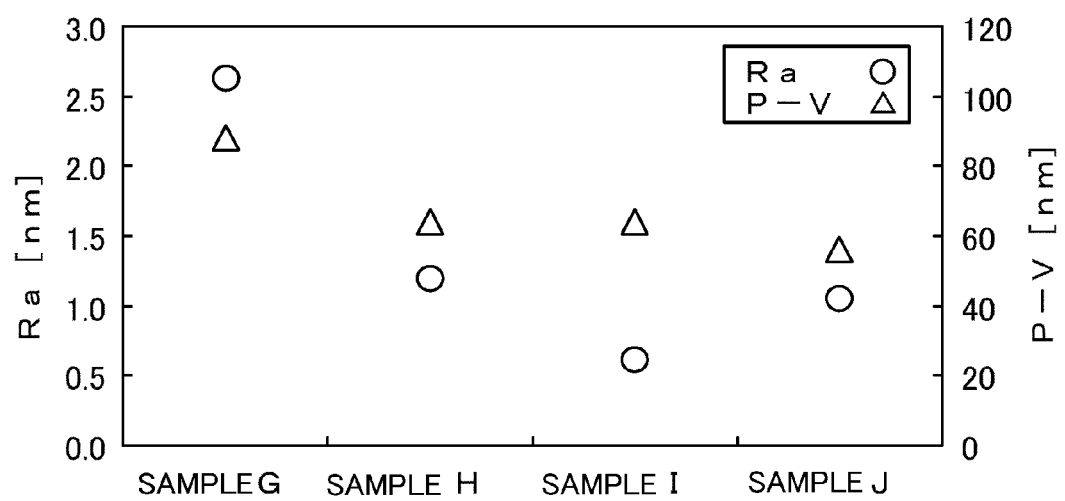
FIG. 16 is a graph showing measurement results of the surface roughness of single crystal silicon layers.

Table 2 and FIG. 16 show the calculated average surface roughness Ra and the calculated maximum peak-to-valley height P-V.

|  | average surface roughness Ra (nm) | maximum peak-to-valley height P-V (nm) |
|---|---|---|
| Sample G | 2.2 | 105.3 |
| Sample H | 1.6 | 47.8 |
| Sample I | 1.6 | 24.7 |
| Sample J | 1.4 | 42.1 |

As shown in Table 2 and FIG. 16, the maximum peak-to-valley height (P-V) of Sample G irradiated with a laser beam after dry etching was 105.3 nm. In contrast, the maximum peak-to-valley height (P-V) of Sample J subjected to plasma treatment using an Ar gas for four minutes was reduced to 42.1 nm. In addition, the average surface roughness Ra of Sample G was 2.2 nm In contrast, the average surface roughness of Sample J was reduced down to 1.4 nm.

This application is based on Japanese Patent Application serial no. 2008-251335 filed with Japan Patent Office on Sep. 29, 2008, the entire contents of which are hereby incorporated by reference.

What is claimed is:

1. A method for manufacturing an SOI substrate, comprising:
   forming an insulating film over a semiconductor substrate;
   irradiating the semiconductor substrate with accelerated ions through the insulating film to form an embrittled region in the semiconductor substrate;
   disposing a surface of the semiconductor substrate and a surface of a base substrate opposite to each other and bonding the surface of the insulating film to the surface of the base substrate;
   causing separation along the embrittled region with a heat treatment after the surface of the insulating film and the surface of the base substrate are bonded to each other to form a semiconductor layer over the base substrate with the insulating film interposed therebetween;
   performing etching treatment on the semiconductor layer;
   irradiating the semiconductor layer subjected to the etching treatment with a laser beam; and
   irradiating the semiconductor layer irradiated with the laser beam with plasma using an inert gas.

2. The method for manufacturing an SOI substrate according to claim 1, wherein the plasma treatment is performed by an inductively coupled plasma method.

3. The method for manufacturing an SOI substrate according to claim 1, wherein a glass substrate is used as the base substrate.

4. The method for manufacturing an SOI substrate according to claim 1, wherein the ion irradiation is performed using an ion doping apparatus.

5. The method for manufacturing an SOI substrate according to claim 4, wherein main components of ions used for the ion irradiation of the semiconductor substrate are $H_3^+$ ions.

6. The method for manufacturing an SOI substrate according to claim 1, wherein the heat treatment is performed at a temperature less than or equal to a strain point of the base substrate.

7. The method for manufacturing an SOI substrate according to claim 1, wherein the inert gas is an argon.

8. A method for manufacturing a semiconductor device comprising:
   forming an insulating film over a semiconductor substrate;
   irradiating the semiconductor substrate with accelerated ions through the insulating film to form an embrittled region in the semiconductor substrate;
   disposing a surface of the semiconductor substrate and a surface of a base substrate opposite to each other and bonding the surface of the insulating film to the surface of the base substrate;
   causing separation along the embrittled region with a heat treatment after the surface of the insulating film and the surface of the base substrate are bonded to each other to form a semiconductor layer over the base substrate with the insulating film interposed therebetween;
   performing first etching treatment on the semiconductor layer;
   irradiating the semiconductor layer subjected to the first etching treatment with a laser beam;
   performing second etching treatment on the semiconductor layer irradiated with the laser beam;
   irradiating the semiconductor layer subjected to the second etching treatment with plasma; and
   etching the semiconductor layer irradiated with the plasma to form separated single crystal semiconductor layers having island shapes.

9. The method for manufacturing a semiconductor device according to claim 8, wherein the plasma treatment is performed by an inductively coupled plasma method.

10. The method for manufacturing a semiconductor device according to claim 8, wherein a glass substrate is used as the base substrate.

11. The method for manufacturing a semiconductor device according to claim 8, wherein the ion irradiation is performed using an ion doping apparatus.

12. The method for manufacturing a semiconductor device according to claim 11, wherein main components of ions used for the ion irradiation of the semiconductor substrate are $H_3^+$ ions.

13. The method for manufacturing a semiconductor device according to claim 8, wherein the heat treatment is performed at a temperature less than or equal to a strain point of the base substrate.

14. A method for manufacturing an SOI substrate, comprising:
   forming a first insulating film over a semiconductor substrate;
   irradiating the semiconductor substrate with accelerated ions through the first insulating film to form an embrittled region in the semiconductor substrate;
   forming a second insulating film over a base substrate;
   disposing the first insulating film over the semiconductor substrate and the second insulating film over the base substrate opposite to each other and bonding a surface of the first insulating film to a surface of the second insulating film;
   causing separation along the embrittled region with a heat treatment after the surface of the first insulating film and the surface of the second insulating film are bonded to each other to form a semiconductor layer over the base substrate with the first insulating film and the second insulating film interposed therebetween;
   performing etching treatment on the semiconductor layer;
   irradiating the semiconductor layer subjected to the etching treatment with a laser beam; and
   irradiating the semiconductor layer irradiated with the laser beam with plasma using an inert gas.

15. The method for manufacturing an SOI substrate according to claim 14, wherein the plasma treatment is performed by an inductively coupled plasma method.

16. The method for manufacturing an SOI substrate according to claim 14, wherein a glass substrate is used as the base substrate.

17. The method for manufacturing an SOI substrate according to claim 14, wherein the ion irradiation is performed using an ion doping apparatus.

18. The method for manufacturing an SOI substrate according to claim 17, wherein main components of ions used for the ion irradiation of the semiconductor substrate are $H_3^+$ ions.

19. The method for manufacturing an SOI substrate according to claim 14, wherein the heat treatment is performed at a temperature less than or equal to a strain point of the base substrate.

20. The method for manufacturing an SOI substrate according to claim 14, wherein the inert gas is an argon.

21. A method for manufacturing an SOI substrate, comprising:
   forming a first insulating film over a semiconductor substrate;

irradiating the semiconductor substrate with accelerated ions through the first insulating film to form an embrittled region in the semiconductor substrate;

forming a second insulating film over a base substrate;

disposing the first insulating film over the semiconductor substrate and the second insulating film over the base substrate opposite to each other and bonding a surface of the first insulating film to a surface of the second insulating film;

causing separation along the embrittled region with a heat treatment after the surface of the first insulating film and the surface of the second insulating film are bonded to each other to form a semiconductor layer over the base substrate with the first insulating film and the second insulating film interposed therebetween;

performing first etching treatment on the semiconductor layer;

irradiating the semiconductor layer subjected to the first etching treatment with a laser beam;

performing second etching treatment on the semiconductor layer irradiated with the laser beam to remove part of the semiconductor layer; and irradiating the semiconductor layer subjected to the second etching treatment with plasma.

22. The method for manufacturing an SOI substrate according to claim 21, wherein the plasma treatment is performed by an inductively coupled plasma method.

23. The method for manufacturing an SOI substrate according to claim 21, wherein a glass substrate is used as the base substrate.

24. The method for manufacturing an SOI substrate according to claim 21, wherein the ion irradiation is performed using an ion doping apparatus.

25. The method for manufacturing an SOI substrate according to claim 21, wherein main components of ions used for the ion irradiation of the semiconductor substrate are $H_3^+$ ions.

26. The method for manufacturing an SOI substrate according to claim 21, wherein the heat treatment is performed at a temperature less than or equal to a strain point of the base substrate.

* * * * *

UNITED STATES PATENT AND TRADEMARK OFFICE
CERTIFICATE OF CORRECTION

PATENT NO. : 8,383,491 B2
APPLICATION NO. : 12/564961
DATED : February 26, 2013
INVENTOR(S) : Kurata et al.

It is certified that error appears in the above-identified patent and that said Letters Patent is hereby corrected as shown below:

In the claims:

In claim 25 at column 36, line 13, "Claim 21" should be --Claim 24--.

Signed and Sealed this
Twenty-fourth Day of September, 2013

Teresa Stanek Rea
*Deputy Director of the United States Patent and Trademark Office*